US012341538B1

(12) United States Patent
Delattre et al.

(10) Patent No.: US 12,341,538 B1
(45) Date of Patent: Jun. 24, 2025

(54) COMPRESSING ENTROPY TABLES WITH INTERPOLATIVE CODING

(71) Applicant: Nintendo Co., Ltd., Kyoto (JP)

(72) Inventors: Alexandre Delattre, Paris (FR); Sylvain Gaeremynck, Paris (FR); Mickaël Corroyer, Paris (FR)

(73) Assignee: Nintendo Co., Ltd., Kyoto (JP)

( * ) Notice: Subject to any disclaimer, the term of this patent is extended or adjusted under 35 U.S.C. 154(b) by 0 days.

(21) Appl. No.: 18/961,011

(22) Filed: Nov. 26, 2024

(51) Int. Cl.
 *H03M 7/34* (2006.01)
 *H03M 7/30* (2006.01)

(52) U.S. Cl.
 CPC .................. *H03M 7/6005* (2013.01)

(58) Field of Classification Search
 CPC .................................. H03M 7/6005
 USPC ...................................... 341/50, 51
 See application file for complete search history.

(56) References Cited

U.S. PATENT DOCUMENTS

| | | | |
|---|---|---|---|
| 6,157,740 A | | 12/2000 | Buerkle et al. |
| 6,975,773 B1* | | 12/2005 | Govindaswamy ..... H04N 19/61 |
| | | | 382/239 |
| 8,898,068 B2* | | 11/2014 | Subbaraman ....... G10L 19/0017 |
| | | | 704/205 |
| 11,379,951 B2 | | 7/2022 | Delattre et al. |
| 11,494,875 B2 | | 11/2022 | Delattre et al. |
| 2009/0034856 A1* | | 2/2009 | Moriya ................ H04N 19/147 |
| | | | 382/238 |
| 2013/0028326 A1* | | 1/2013 | Moriya .................. H04N 19/46 |
| | | | 375/E7.125 |
| 2014/0140400 A1* | | 5/2014 | George ................... H03M 7/42 |
| | | | 375/240.12 |

OTHER PUBLICATIONS

Huffman, "A Method for the Construction of Minimum-Redundancy Codes" Proceedings Of the I.R.E. (Sep. 1952).
En.wikipedia.org/wiki/Arithmetic_coding (2025).
Duda et al, "The use of asymmetric numeral systems as an accurate replacement for Huffman coding", Picture Coding Symposium (2015).

(Continued)

*Primary Examiner* — Jean B Jeanglaude
(74) *Attorney, Agent, or Firm* — Nixon & Vanderhye P.C.

(57) ABSTRACT

A symbol sequence is entropy-encoded using a table of symbol occurrences, and an integer value f is used to encode the table of symbol occurrences. The integer value f is used to adaptively decode the table of symbol occurrences, including (i) decoding each entry of a cumulative table of symbol occurrences by successively subdividing decoding ranges of the cumulative table of symbol occurrences at their respective middle indexes and, for each decoding range: calculating, from decoded entries of the cumulative table of symbol occurrences, an entry at a first index+f mod(an entry at a last index−the entry at the first index+1) to decode an entry at the respective middle index of the decoding range, and calculating f div(the entry at the last index−the entry at the first index+1) to update f; (ii) calculating the table of symbol occurrences from the decoded entries of the cumulative table of symbol occurrences; and applying the decoded table of symbol occurrences to entropy-decode the received encoded symbol sequence.

30 Claims, 27 Drawing Sheets

(56) References Cited

OTHER PUBLICATIONS

Moffat et al, Binary Interpolative Coding for Effective Index Compression. Information Retrieval 3, 25-47 (2000). doi. org/10.1023/A:1013002601898, link.springer.com/article/10.1023/A:1013002601898.

Turpin et al, Housekeeping for prefix coding, IEEE Transactions on Communications 48(4):622-628, 48(4):622-628 (May 2000 DOI: 10.1109/26.843129).

Moffat et al, Large-Alphabet Semi-Static Entropy Coding Via Asymmetric Numeral Systems, ACM Transactions on Information Systems 38(4) May 2020 DOI: 10.1145/3397175.

Trotman, "Compressing Inverted Files", Information Retrieval 6, 5-19 (2003).

Teuhola, "Tournament Coding of Integer Sequences", The Computer Journal vol. 52 No. 3 (2009).

Duda, Encoding of probability distributions for Asymmetric Numeral Systems: https://www.researchgate.net/publication/352373099 (2022).

Truong et al, Selective review of offline change point detection methods: Signal Processing vol. 167, Feb. 2020, 107299 https://arxiv.org/abs/1801.00718.

Ruptures: change point detection in Python: https://arxiv.org/abs/1801.00826 https://centre-borelli.github.io/ruptures-docs/ (2025).

Mia, Change Point Detection with Copula Entropy based Two-Sample Test: https://arxiv.org/abs/2403.07892 (2024).

Unakafov et al, Change-point detection using the conditional entropy of ordinal patterns: https://arxiv.org/abs/1510.01457 (2017).

Killick et al, Optimal detection of changepoints with a linear computational cost: https://arxiv.org/abs/1101.1438 (2012, 2024).

Daass et al, Using an adaptive entropy-based threshold for change detection methods—Application to fault-tolerant fusion in collaborative mobile robotics: https://ieeexplore.ieee.org/document/8820667, 2019 6th International Conference on Control, Decision and Information Technologies (CoDIT), Paris, France, 2019, pp. 1173-1178, doi: 10.1109/CoDIT.2019.8820667.

https://en.wikipedia.org/wiki/LZFSE (2025).

https://en.wikipedia.org/wiki/Minimum_description_length#Two-Part_codes (2025).

Howard et al (1993) "Fast and efficient lossless image compression". In: Storer JA and Cohn M, Eds., Proc. 1993 IEEE Data Compression Conference. IEEE Computer Society Press, Los Alamitos, California, pp. 351-360 (1993).

Sugiura et al, "Optimal Golomb-Rice Code Extension for Lossless Coding of Low-Entropy Exponentially Distributed Sources," in IEEE Transactions on Information Theory, vol. 64, No. 4, pp. 3153-3161, Apr. 2018, doi: 10.1109/TIT.2018.2799629.

Wang et al, "Variants of Golomb Coding and the n-ary Versions," in IEEE Transactions on Communications, vol. 68, No. 12, pp. 7460-7472, Dec. 2020, doi: 10.1109/TCOMM.2020.3022396.

Lakhdhar et al, "Context-Based Adaptive Arithmetic Encoding of EAVQ Indices," in IEEE Transactions on Audio, Speech, and Language Processing, vol. 20, No. 5, pp. 1473-1481, Jul. 2012, doi: 10.1109/TASL.2011.2181834.

\* cited by examiner

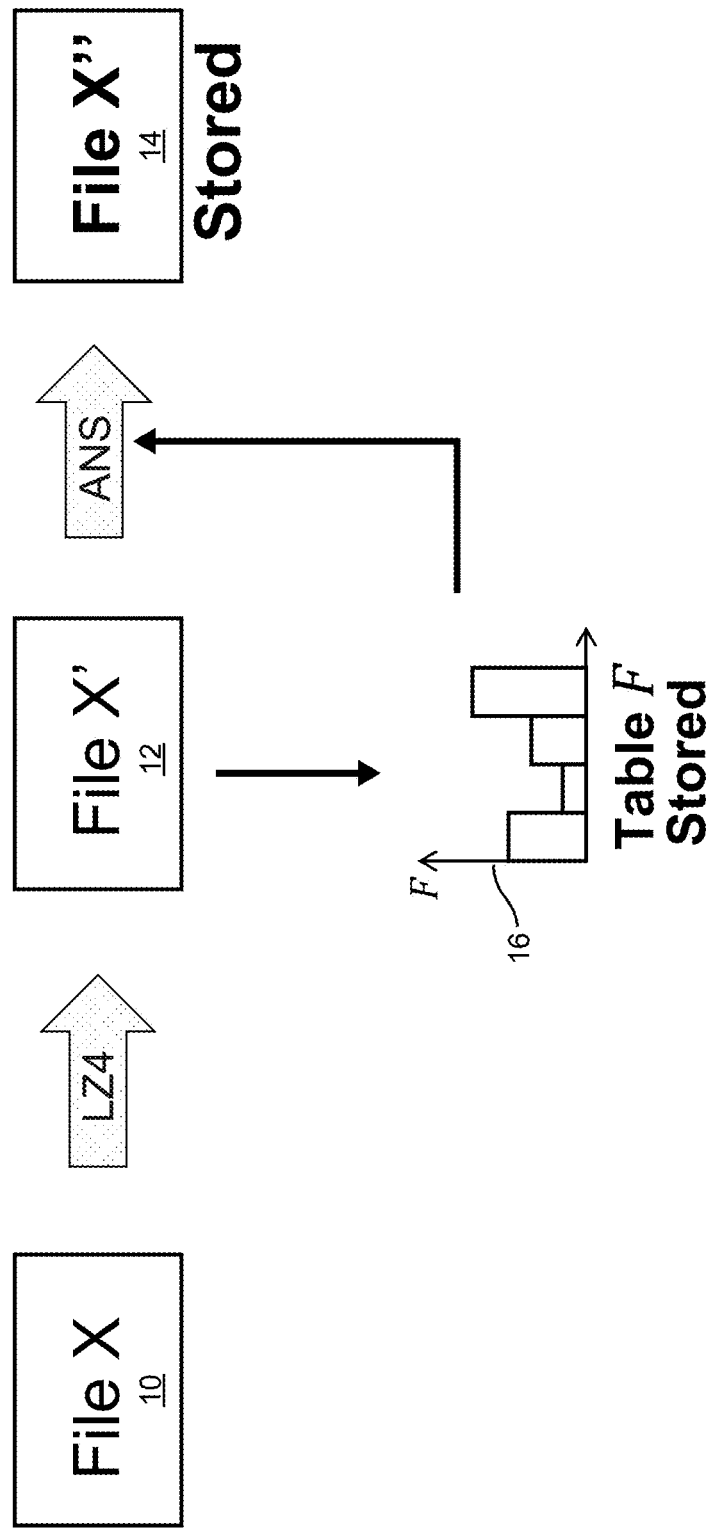

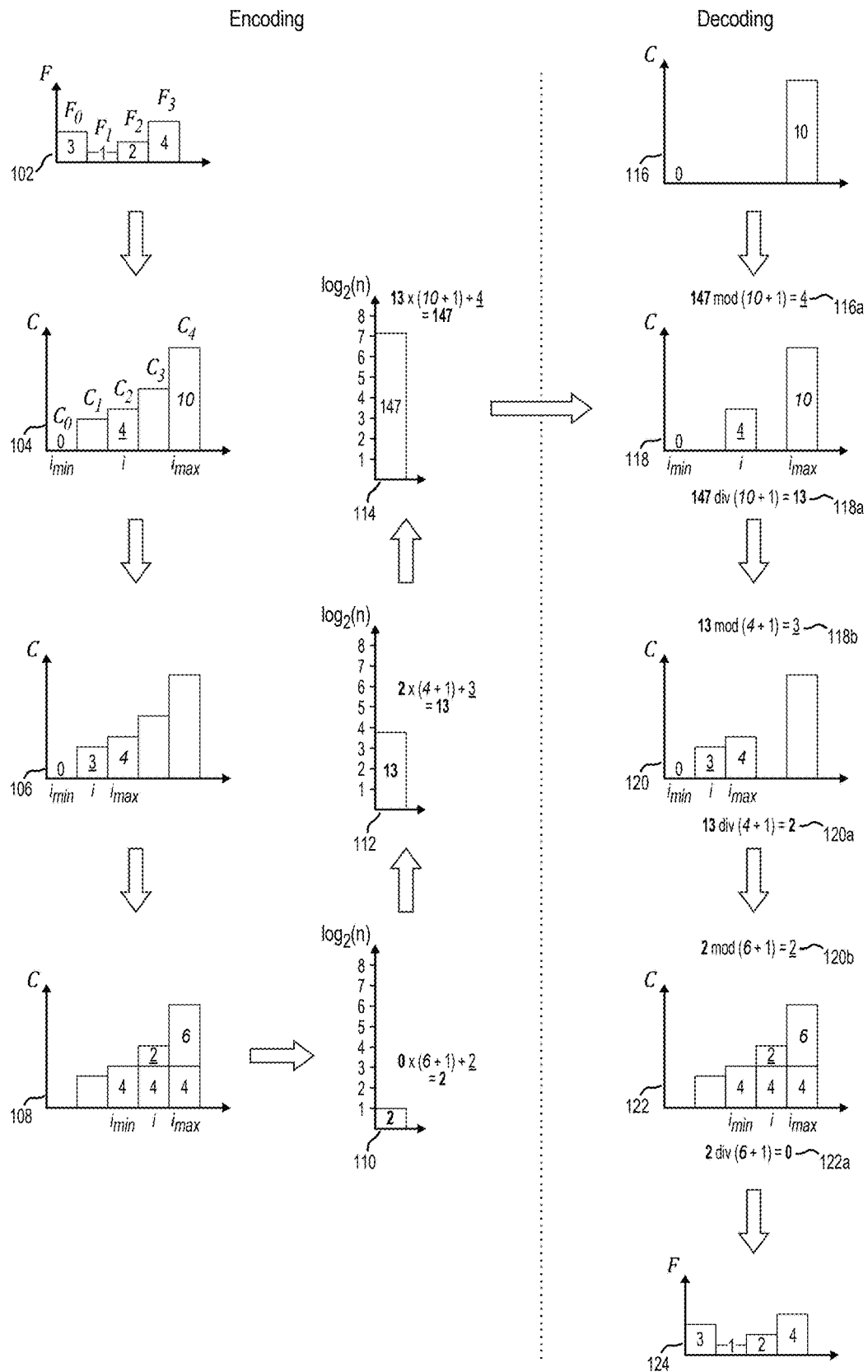
FIG. 4: Example of encoding and decoding of a table of symbol occurrence of size 4. The whole table encoding is $f = 147$.

Forward pass to estimate the compression size of the

Backward pass to estimate the compression size of the right-child segment.

Sum of the estimated compression sizes of the two child segments.
The index of the minimum of this sum represents the best potential cut point.

Segmentation example

Fig. 10
LZ4 block sequence format (Prior Art)

Fig. 10A
LZ4 block sequence format (Prior Art)

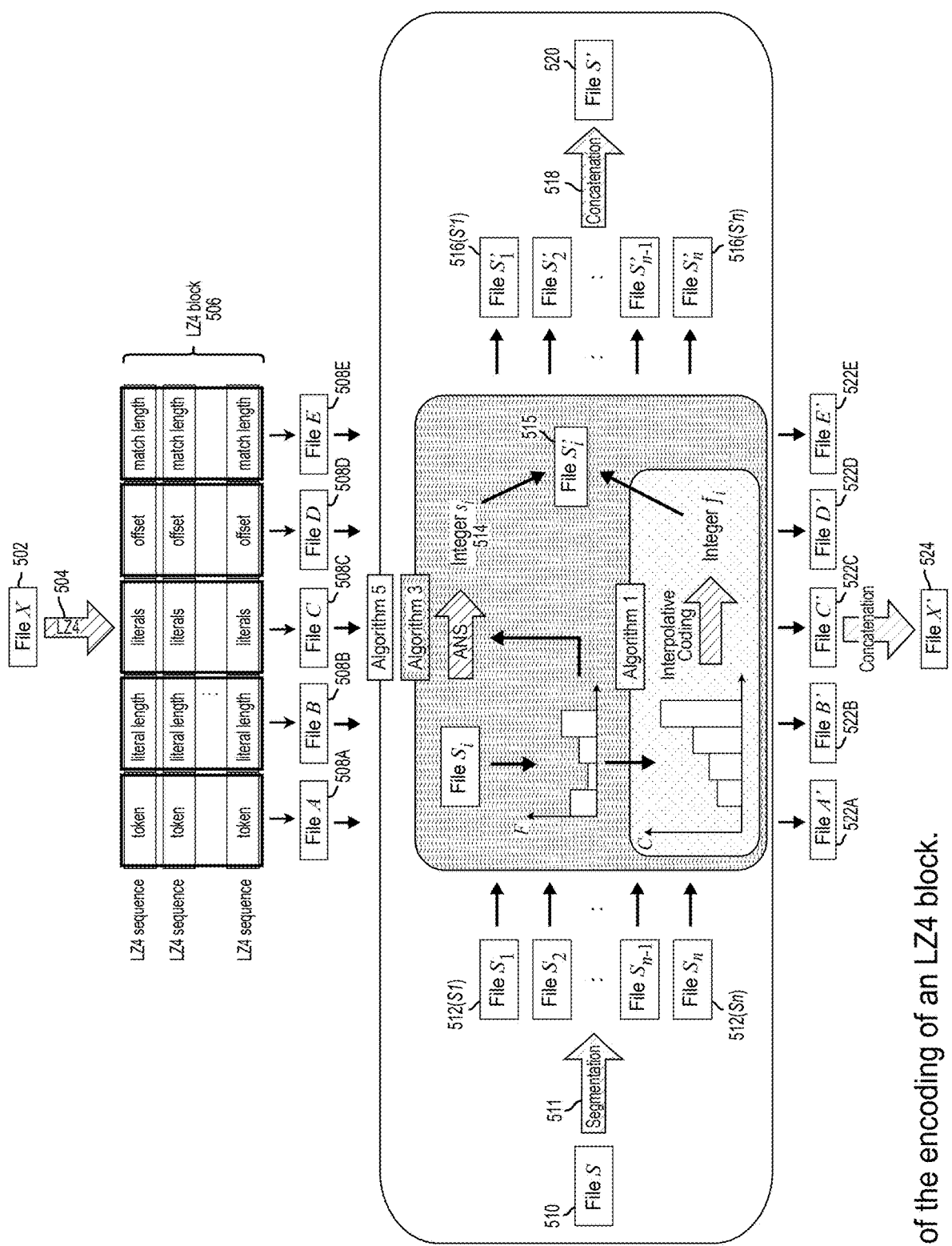
FIG. 11 Overview of the encoding of an LZ4 block.

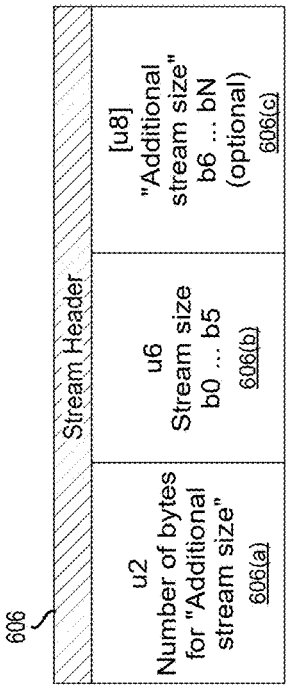
FIG. 12C
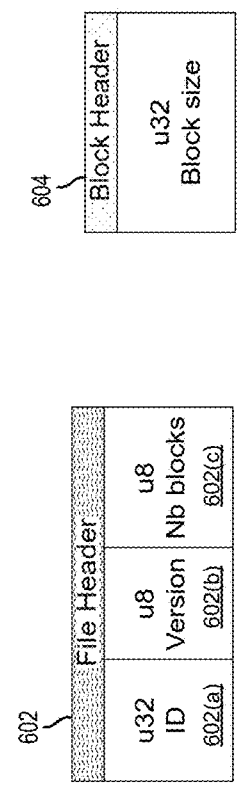
FIG. 12D
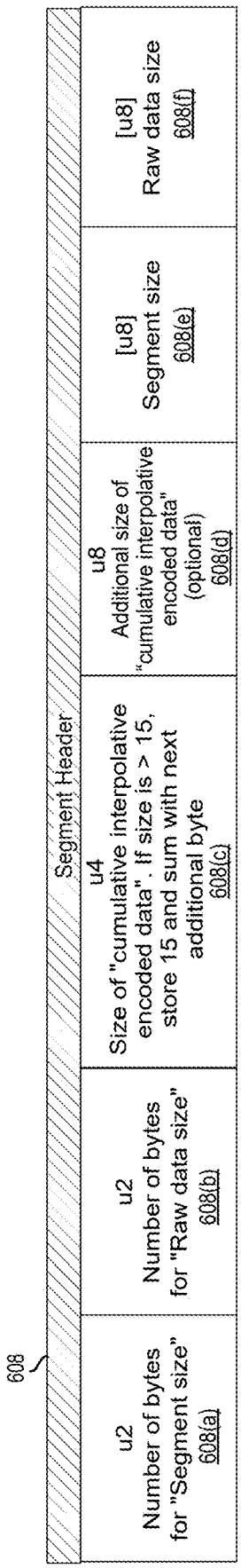
FIG. 12E
FIG. 12F

COMPRESSING ENTROPY TABLES WITH INTERPOLATIVE CODING

CROSS-REFERENCE TO RELATED APPLICATIONS

None.

FIELD

This technology relates to encoding and decoding, and to systems, apparatus, circuits, methods, techniques and storage devices for entropy encoding and including further coding the codebook, parameters and/or tables used for entropy encoding. This technology further relates to entropy encoding an already-compressed file and then encoding the symbol occurrence table used for the entropy encoding. The technology also relates to entropy-based file segmentation in such contexts.

BACKGROUND

Movies, videos, digital music, video games and other content are streamable with reasonably low latency over limited bandwidth connections such as cellular telephone and home Wi-Fi networks because the content is compressed before being streamed.

There generally are two kinds of compression: lossy and lossless. Lossy compression reduces the size of the content by deleting certain information. Typically, the deleted information will not be missed (for example, high audio frequencies only some people can hear, minute details of a photograph or image that will be displayed at only lower resolution so the details cannot be seen, etc.).

With lossless compression, every bit of information in the source file or content is present after it is compressed, and restored when the file is decompressed. Lossless compression is useful for compressing computer executables since losing any part of the computer instructions can cause execution errors (this would be like trying to follow driving directions where every third line was deleted).

One common form of lossless compression is called "entropy encoding". An entropy encoding is a coding scheme that involves assigning codes to symbols so as to match code lengths with probabilities of occurrence of the symbols. The most commonly occurring symbols are then encoded with the shortest codes. Samuel F. B. Morse and his friend Alfred Vail used entropy encoding when they devised the "Morse Code" in the 1840's. Morse and Vail counted the number of each letter in a printer's movable type set to estimate the frequency of occurrence of letters in newsprint (because they were trying to come up with a universal code that could be used for any arbitrary message that might be sent over telegraphy, they were not looking at actual frequency of occurrence of symbols in any particular message). Here is what they found:

12,000 E 2,500 F
9,000 T 2,000 W, Y
8,000 A, I, N, O, S 1,700 G, P
6,400 H 1,600 B
6,200 R 1,200 V
4,400 D 800 K
4,000 L 500 Q
3,400 U 400 J, X
3,000 C, M 200 Z

Since the letter "E" occurred most frequently, Morse and Vail assigned it a single "dot" (".")—the shortest code a telegrapher could send. Morse and Vail similarly assigned the next shortest code (a single "dash" or "-") to the letter T because that letter occurred next most frequently. And so on. Morse and Vail assigned longer codes comprising combinations of four dots and/or dashes to "Q", "J", X" and "Z" because those letters occurred least frequently. There was no need to send the "codebook" with each message; the Morse Code soon became standardized so most telegraphers memorized it.

Entropy encoding is commonly used today for all sorts of data compression, with Huffman and Arithmetic coding perhaps being the most pervasive. They often work by exploiting redundancy at the output of a quantizer. See Huffman, "A Method for the Construction of Minimum-Redundancy Codes" Proceedings Of the I.R.E. (September 1952). Arithmetic coding encodes the entire message into a single number, an arbitrary-precision fraction q, where $0.0 \leq q < 1.0$. It represents the current information as a range, defined by two numbers. A recent family of entropy coders called asymmetric numeral systems (ANS) allows for faster implementations thanks to directly operating on a single natural number representing the current information. en.wikipedia.org/wiki/Arithmetic_coding; Duda et al, "The use of asymmetric numeral systems as an accurate replacement for Huffman coding", Picture Coding Symposium (2015).

One example straightforward method for compressing a sequence of symbols (for example a computer data file 10) is to use a two-part code based on an ANS-type entropy encoder as shown in FIG. 1. This involves first constructing a table F (item 16, the two-part code "codebook") containing the number of occurrences) of each symbol in the sequence (i.e., the "message") to be compressed. FIG. 1 shows this table F as a histogram. The table F, which makes it possible to estimate the probability of occurrence of each symbol, is then used by an ANS encoder to iteratively encode each symbol of the sequence (which in the example shown is first compressed using LZ4 lossless compression to reduce redundancy) into a single large number (the encoding). Note that in this example, the table F 16 is "customized" to the particular sequence being compressed since provides the most accurate estimate of the number of occurrences of each symbol in the actual message to be encoded. Thus, in example embodiments, each unique sequence to be encoded has its own corresponding symbol occurrence table F.

When the table F remains the same throughout the sequence encoding process for encoding a particular sequence, the name "static encoding" is applied (as opposed to "adaptive encoding" where the table can change at each encoding iteration). As the static ANS decoder will need the table F 16 (the codebook) to carry out the reverse of the encoding process, the table is provided to the decoder along with the encoding 14 in what will be the compressed sequence:

compressed sequence=encoding+symbol occurrence table *F*

Because the symbol occurrence table F is also communicated to the decoder, it effectively becomes part of the compressed size of the compressed sequence. Therefore, it is desirable to efficiently compress table F in order to reduce overall compression size of the compressed sequence.

SUMMARY

In one example embodiment, a decoding method may be performed using at least one processor and/or processing circuit, comprises: receiving an encoded symbol sequence entropy-encoded using a table of symbol occurrences; receiving an integer value f encoding the table of symbol occurrences; using the received integer value f to adaptively decode the table of symbol occurrences, including: (i) decoding each entry of a cumulative table of symbol occurrences by successively subdividing decoding ranges of the cumulative table of symbol occurrences at their respective middle indexes and, for each decoding range: calculating, from decoded entries of the cumulative table of symbol occurrences, an entry at a first index+f mod(an entry at a last index−the entry at the first index+1) to decode an entry at the respective middle index of the decoding range, and calculating f div(the entry at the last index−the entry at the first index+1) to update f; (ii) calculating the table of symbol occurrences from the decoded entries of the cumulative table of symbol occurrences; and applying the decoded table of symbol occurrences to entropy-decode the received encoded symbol sequence.

To clarify, the first reference "a table of symbol occurrences" in the above example refers to table F—not cumulative table C—in the example embodiment described in detail below. Indeed «cumulative interpolative encoding/decoding» in example embodiments includes the conversion between tables F and C (hence the «cumulative» term in the name) which is above described in (ii). So at the end of (i), the example embodiment has decoded table C and then at the end of (ii), the example embodiment has decoded table F; so (i)+(ii) decodes table F. To put it another way:

«Cumulative interpolative decoding» decodes table F by:
i) Decoding table C with «interpolative decoding»
ii) Calculating table F from table C.

In one embodiment, the decoding may further include receiving a second integer value m, using a zero value as a lower bound of the cumulative table of symbol occurrences, and using the received second integer value m as an upper bound of the cumulative table of symbol occurrences.

In one embodiment, the decoding may further include: receiving a second integer value m, inserting a zero value as a first entry of the cumulative table of symbol occurrences, and inserting the received second integer value m as a last entry of the cumulative table of symbol occurrences.

In an embodiment, the received second integer value m may be obtained from a header metadata of the encoded symbol sequence.

In an embodiment, the decoding may further include decoding the entries of the cumulative table by traversing a tree of subdivided decoding ranges and calculating an arithmetic division at each node of the tree before child nodes of said each node. The entries of the cumulative table are decoded by traversing the tree of subdivided decoding ranges in a depth-first pre-order and calculating an arithmetic division at each node of the tree.

In an embodiment, the received integer value f may be represented as a big number (bignum).

In an embodiment, the decoding may further include renormalizing to allow faster and more memory-efficient decoding.

In an embodiment, the encoded symbol sequence may comprise an aggregation of different components comprising token, literal length, literals, offset, and match length, of sequences of an LZ4 block.

In an embodiment, using the received integer value f may consist of using only integer arithmetic, shifts, logic operations, loads and stores to recover entries of the table of symbol occurrences.

In an embodiment, applying may comprise applying Asymmetric Numeral Systems (ANS) entropy decoding to decode the received encoded symbol sequence.

In an embodiment, the decoding may further include iterating or recursing the successively subdividing and the calculating for each decoding range.

In an embodiment, the decoding may further include independently decoding segments of the encoded symbol sequence resulting from entropy-based binary segmentation of the symbol sequence and reconstructing the symbol sequence based on segment headers.

In an embodiment, the decoding may further comprise executing with at least one processor, instructions losslessly recovered by decoding the received entropy-encoded symbol sequence.

In an embodiment, the decoding may further comprise generating with at least one graphics processing unit, at least a portion of an interactive graphical display based at least in part on graphical data losslessly recovered by decoding the received entropy-encoded symbol sequence.

In an embodiment, a decoder may comprise at least one processor and/or processing circuit configured to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences.

In such embodiment:
The operations may further include apply the calculated table of symbol occurrences to entropy-decode an encoded symbol sequence and/or execute at least a portion of the entropy-decoded symbol sequence and/or stream at least a portion of the entropy-decoded symbol sequence.
The operations may further comprise: receiving a second integer value m, using a zero value as a lower bound of the cumulative table of symbol occurrences, and using the received second integer value m as an upper bound of the cumulative table of symbol occurrences.
The operations may further comprise: receiving a second integer value m, inserting a zero value as a first entry of the cumulative table of symbol occurrences, and inserting the received second integer value m as a last entry of the cumulative table of symbol occurrences.
The operations may further comprise obtaining the received second integer value m from a header metadata of the encoded symbol sequence.
The operations may further comprise decode the entries of the cumulative table by traversing a tree of subdivided decoding ranges and calculate an arithmetic division at each node of the tree before child nodes of said each node; and/or decoding the entries of the cumulative table by traversing the tree of subdivided decoding ranges in a depth-first pre-order and calculating an arithmetic division at each node of the tree.
The received integer value f is represented as a big number (bignum).

The operations may further comprise renormalizing to allow faster and more memory-efficient decoding.

The encoded symbol sequence may comprise an aggregation of different components comprising token, literal length, literals, offset, and match length, of sequences of an LZ4 block.

Using may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The operations may further comprise iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or execute with at least one processor, instructions losslessly recovered by decoding the entropy-encoded symbol sequence; and/or generate with at least one graphics processing unit, at least a portion of an interactive graphical display based at least in part on graphical data losslessly recovered by decoding the entropy-encoded symbol sequence.

An embodiment of a system for generating an animated graphic may comprise at least one storage device that stores (i) at least one data block representing an encoded symbol sequence entropy-encoded using a table of symbol occurrences, and (ii) an integer value f encoding the table of symbol occurrences; at least one processor and/or processing circuit connected to the at least one storage device, the at least one processor and/or processing circuit performing operations comprising: using the integer value f to adaptively decode the table of symbol occurrences, including: (i) decoding each entry of a cumulative table of symbol occurrences by successively subdividing decoding ranges of the cumulative table of symbol occurrences at their respective middle indexes and, for each decoding range: calculating, from decoded entries of the cumulative table of symbol occurrences, an entry at a first index+f mod (an entry at a last index−the entry at the first index+1) to decode an entry at the respective middle index of the decoding range, and calculating f div(the entry at the last index−the entry at the first index+1) to update f; (ii) calculating the table of symbol occurrences from the decoded entries of the cumulative table of symbol occurrences; and applying the decoded table of symbol occurrences to entropy-decode the encoded symbol sequence represented by the at least one data block, at least a portion of the entropy-decoded symbol sequence representing a graphic and/or a graphic animation operation; and a device that generates an animated graphic based at least in part on the entropy-decoded symbol sequence.

In such embodiment:

The operations may further include: receiving a second integer value m, using a zero value as a lower bound of the cumulative table of symbol occurrences, and using the received second integer value m as an upper bound of the cumulative table of symbol occurrences.

The operations may further include: receiving a second integer value m, using a zero value as a first entry of the cumulative table of symbol occurrences, and inserting the received second integer value m as a last entry of the cumulative table of symbol occurrences.

The received second integer value m may be obtained from a header metadata of the encoded symbol sequence.

The operations may further comprise decoding the entries of the cumulative table by traversing a tree of subdivided decoding ranges and calculating an arithmetic division at each node of the tree before child nodes of said each node.

The operations may further comprise decoding the entries of the cumulative table by traversing the tree of subdivided decoding ranges in a depth-first pre-order and calculating an arithmetic division at each node of the tree.

The received integer value f may be represented as a big number (bignum).

The operations may further comprise renormalizing to allow faster and more memory-efficient decoding.

The encoded symbol sequence may comprise an aggregation of different components comprising token, literal length, literals, offset, and match length, of sequences of an LZ4 block.

Using may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The operations may further comprise iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or executing instructions losslessly recovered by decoding the entropy-encoded symbol sequence; and/or at least partly decoding the entropy-encoded symbol sequence in a cloud environment.

The device may comprise at least one graphics processing unit configured to generate at least a portion of an interactive graphical display based at least in part on graphical data losslessly recovered by decoding the entropy-encoded symbol sequence.

The device may include an emulator that generates the animated graphic based at least in part on the symbol sequence.

An example embodiment of an encoding method performed using at least one processor and/or processing circuit, may comprise: generating a table of symbol occurrences based on occurrences of symbols in a symbol sequence to be entropy-encoded; entropy-encoding the symbol sequence using the table of symbol occurrences; using an integer value f to adaptively encode the table of symbol occurrences including: (i) calculating a cumulative table of symbol occurrences from the table of symbol occurrences, (ii) encoding each entry of the cumulative table of symbol occurrences by successively subdividing encoding ranges of the cumulative table of symbol occurrences at their respective middle indexes and, for each encoding range: calculating f×(an entry at a last index−an entry at a first index+1)+(an entry at the respective middle index−the entry at the first index) to encode an entry at the respective middle index of the encoding range and update f; and forming at least one data block representing (i) the entropy-encoded symbol sequence, and (ii) the resulting integer value f encoding the table of symbol occurrences.

The above corresponds in example embodiments described in more detail below to:
«Cumulative interpolative coding» encodes table F by:
Calculating table C from table F
Encoding table C with «interpolative coding»
In such embodiment:
Encoding may further include generating a second integer value m, using a zero value as a lower bound of the cumulative table of symbol occurrences, and using the generating second integer value m as an upper bound of the cumulative table of symbol occurrences.
Encoding may further include generating a second integer value m, inserting a zero value as a first entry of the cumulative table of symbol occurrences, and inserting the generating second integer value m as a last entry of the cumulative table of symbol occurrences.
The operations may further comprise including the second integer value m as metadata in a header associated with the encoded symbol sequence.
Encoding may further include encoding the entries of the cumulative table by traversing a tree of subdivided encoding ranges and calculating an arithmetic multiplication at each node after child nodes of each said node.
Encoding may further include encoding the entries of the cumulative table by traversing the tree of subdivided encoding ranges in a depth-first reverse post-order and calculating an arithmetic multiplication at each node.
Encoding may further include representing the generated integer value f as a big number (bignum).
Encoding may further include renormalizing to allow faster and more memory-efficient decoding.
The symbol sequence may comprise an aggregation of different components comprising token, literal length, literals, offset, and match length, of sequences of an LZ4 block.
Using the integer value f may consist of using only integer arithmetic, shifts, logic operations, loads and stores to encode entries of the table of symbol occurrences.
Applying may comprise applying Asymmetric Numeral Systems (ANS) entropy encoding to encode the symbol sequence.
Encoding may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.
The symbol sequence may include losslessly-encoded executable instructions and/or bit sequences configured to control a graphics processing unit to generate at least a portion of an interactive graphical display.
The encoding may further include segmenting the symbol sequence before encoding using an entropy-based binary segmentation that reduces or minimizes at each segmentation step, a sum of entropy and a size of the table of symbol occurrences of all resulting segments.
An embodiment of a system for generating an animated graphic may comprise: at least one storage device; and at least one processor and/or processing circuit connected to the at least one storage device, the at least one processor and/or processing circuit performing operations comprising: generating a table of symbol occurrences based on occurrences of symbols in a symbol sequence to be entropy-encoded, the symbol sequence at least in part contributing to generation of an animated graphic; entropy-encoding the symbol sequence using the table of symbol occurrences; using an integer value f to adaptively encode the table of symbol occurrences, including: (i) calculating a cumulative table of symbol occurrences from the table of symbol occurrences, (ii) encoding each entry of the cumulative table of symbol occurrences by successively subdividing encoding ranges of the cumulative table of symbol occurrences at respective middle indexes and, for each encoding range: calculating f×(an entry at a last index−an entry at a first index+1)+(an entry at the respective middle index−the entry at the first index) to encode an entry at the respective middle index of the encoding range and update f; forming at least one data block representing (i) the entropy-encoded symbol sequence, and (ii) the integer value f representing the encoded table of symbol occurrences; and storing the at least one data block in the storage device.

In such embodiment:
The operations may further comprise: generating a second integer value m, using a zero value as a lower bound of the cumulative table of symbol occurrences, and using the generated second integer value m as an upper bound of the cumulative table of symbol occurrences.
The operations may further comprise: generating a second integer value m, inserting a zero value as a first entry of the cumulative table of symbol occurrences, and inserting the generated second integer value m as a last entry of the cumulative table of symbol occurrences.
The operations may further comprise including the second integer value m as metadata in a header associated with the encoded symbol sequence.
The operations may further comprise encoding the entries of the cumulative table by traversing a tree of subdivided encoding ranges and calculating an arithmetic multiplication at each node after child nodes of each said node.
The operations may further include encoding the entries of the cumulative table by traversing the tree of subdivided encoding ranges in a depth-first reverse post-order and calculating an arithmetic multiplication at each node; and/or representing the received integer value f as a big number (bignum); and/or renormalizing to allow faster and more memory-efficient encoding.
The symbol sequence may comprise an aggregation of different components comprising token, literal length, literals, offset, and match length, of sequences of an LZ4 block.
Using f may consist of using only integer arithmetic, shifts, logic operations, loads and stores to encode entries of the table of symbol occurrences.
Applying may comprise applying Asymmetric Numeral Systems (ANS) entropy encoding to encode the symbol sequence.
The operations may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.
The symbol sequence may include losslessly-encoded executable instructions.
The symbol sequence may include bit sequences configured to control at least one graphics processing unit to generate at least a portion of an interactive graphical display.
The operations may further include segmenting the symbol sequence before encoding using an entropy-based binary segmentation that reduces or minimizes at each segmentation step, a sum of entropy and a size of the table of symbol occurrences of all resulting segments.

An embodiment, of a non-transitory storage may be configured to store instructions that cause at least one processor and/or processing circuit to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences.

In such embodiment, the operations may further comprise:

apply the calculated table of symbol occurrences to entropy-decode an encoded symbol sequence and/or use at least a portion of the entropy-decoded symbol sequence to stream data representing at least a portion of a graphical user interaction; and/or execute at least a portion of the entropy-decoded symbol sequence; and/or stream at least a portion of the entropy-decoded symbol sequence.

receiving a second integer value m, using a zero value as a lower bound of the cumulative table of symbol occurrences, and using the received second integer value m as an upper bound of the cumulative table of symbol occurrences.

receiving a second integer value m, inserting a zero value as a first entry of the cumulative table of symbol occurrences, and inserting the received second integer value m as a last entry of the cumulative table of symbol occurrences.

obtaining the received second integer value m from a header metadata of the encoded symbol sequence.

decode the entries of the cumulative table by traversing a tree of subdivided decoding ranges and calculating an arithmetic division at each node of the tree before child nodes of said each node; and/or decoding the entries of the cumulative table by traversing the tree of subdivided decoding ranges in a depth-first pre-order and calculating an arithmetic division at each node of the tree.

In such embodiment:

The received integer value f may be represented as a big number (bignum).

The operations may further comprise renormalizing to allow faster and more memory-efficient decoding.

The encoded symbol sequence may comprise an aggregation of different components comprising token, literal length, literals, offset, and match length, of sequences of an LZ4 block.

Using f may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The operations may further comprise iterating the successively subdividing and the calculating for each decoding range; and/or recursing the successively subdividing and the calculating for each decoding range.

The operations may further comprise independently decoding segments of the encoded symbol sequence resulting from entropy-based binary segmentation of the symbol sequence and reconstructing the symbol sequence based on segment headers.

An embodiment of a method for operating a cloud-based device may comprise: send, over at least one network and/or communications link, a command and/or control signal to a remotely-located decoder processor and/or decoder processing circuit, the command and/or control signal causing the remotely-located decoder processor and/or decoder processing circuit to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences; and apply the calculated table of symbol occurrences to entropy-decode an encoded symbol sequence; and receive, over the at least one network and/or communications link, visual and/or audio information generated or produced at least in part using the entropy-decoded symbol sequence.

In such embodiment:

receive may comprise receive data representing at least a portion of at least one graphical presentation based at least in part on the entropy-decoded symbol sequence.

The method may further include: receiving a second integer value m, using a zero value as a lower bound of the cumulative table of symbol occurrences, and using the received second integer value m as an upper bound of the cumulative table of symbol occurrences.

The method may further include: receiving a second integer value m, inserting a zero value as a first entry of the cumulative table of symbol occurrences, and inserting the received second integer value m as a last entry of the cumulative table of symbol occurrences.

The received second integer value m may be obtained from a header metadata of the encoded symbol sequence.

The method may further include decoding the entries of the cumulative table by traversing a tree of subdivided decoding ranges and calculating an arithmetic division at each node of the tree before child nodes of said each node. The entries of the cumulative table may be decoded by traversing the tree of subdivided decoding ranges in a depth-first pre-order and calculating an arithmetic division at each node of the tree.

The received integer value f may be represented as a big number (bignum).

The method may further include renormalizing to allow faster and more memory-efficient decoding.

The encoded symbol sequence may comprise an aggregation of different components comprising token, literal length, literals, offset, and match length, of sequences of an LZ4 block.

Using f may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The method may further include iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or executing with at least one processor, instructions losslessly recovered by decoding the entropy-encoded symbol sequence; and/or generating with at least one graphics processing unit, at least a portion of an interactive graphical display based at least in part on graphical data losslessly recovered by decoding the entropy-encoded symbol sequence.

Any feature outlined above may be used in combination with any other feature or combination of features.

BRIEF DESCRIPTION OF THE DRAWINGS

FIG. 1 shows a prior art LZ4/ANS encoding process.

FIG. 4 schematically shows an example of encoding and decoding a table of symbol occurrence of size 4. The whole table encoding is f=147.

FIGS. 10, 10A show example prior art LZ4 block sequence formats.

FIG. 11 schematically shows an example overview of new encoding of an LZ4 block.

FIG. 12C shows an example File Header format.

FIG. 12D shows an example Block Header format.

FIG. 12E shows an example Stream Header format.

FIG. 12F shows an example Segment Header format.

DETAILED DESCRIPTION OF NON-LIMITING EMBODIMENTS

Example Encoding/Decoding System(s)

Figure 2A:
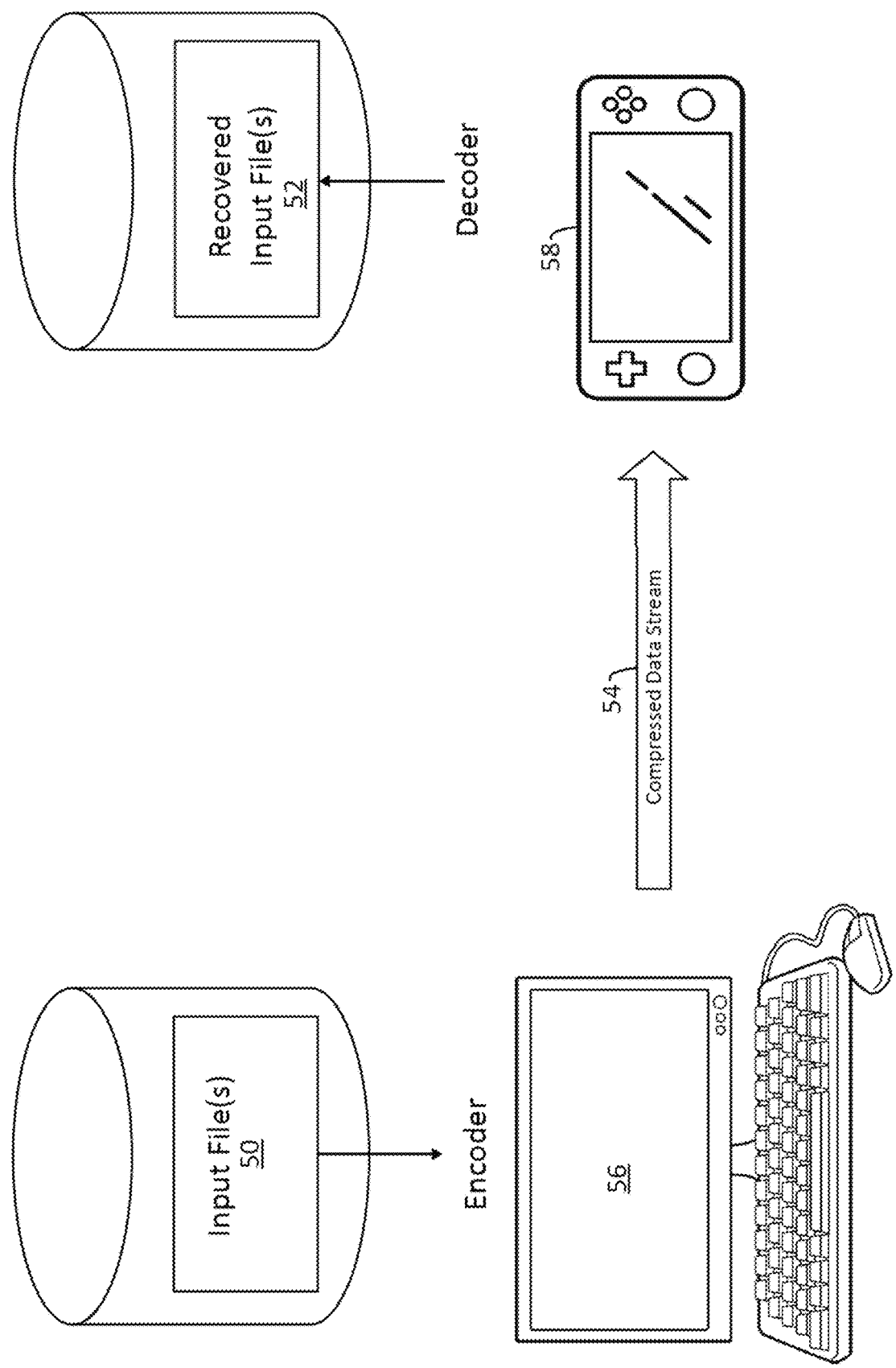
FIGS. 2A, 2B show example encoding and decoding systems.
Figure 2B:
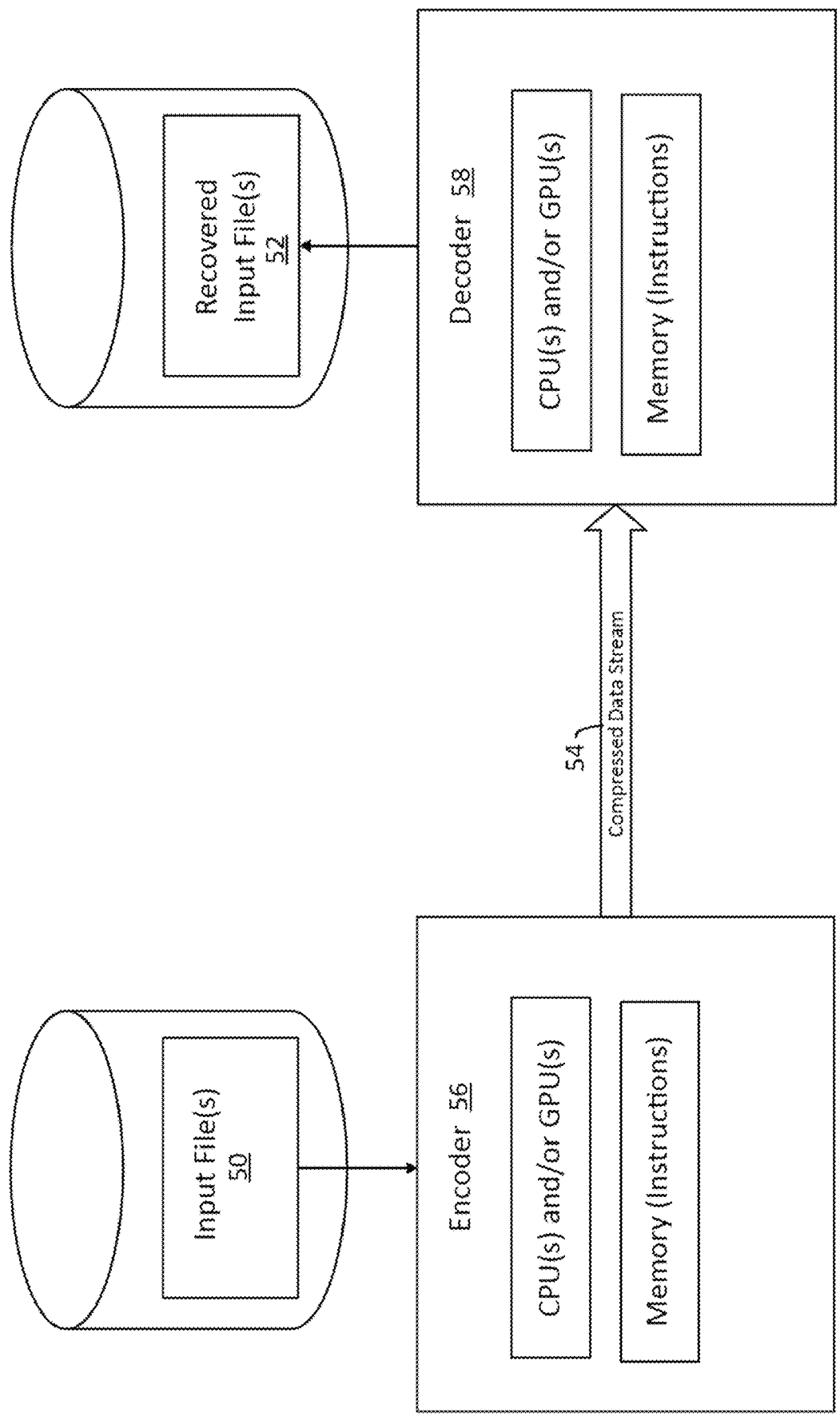

FIGS. 2A, 2B show example encoding and decoding systems. An input file(s) 50 containing a sequence of symbols (which may be stored on a storage medium) is encoded by an encoding device 56 to produce a compressed data stream or data file 54. The compressed data stream or data file 54 is communicated from the encoding device 56 to one or more decoding device(s) 58. The decoding device(s) 58 can be located remotely to the encoding device 56, or can be co-located with the encoding device. The communication medium for communicating the compressed data stream from the encoding device 56 to the decoding device 58 may comprise a memory storage device and/or networks and/or wireless links and/or cables and/or signal pathways and/or or any other arrangement for communicating digital data from one component to one or more other components.

The (each) decoding device 58 decodes the compressed data stream or data file 54 to recover the input file 52. Because the compression is lossless in example embodiments, the recovered input file exactly matches the original input file. In the example non-limiting embodiment shown, the decoding device(s) 58 may recover the input file(s) 52 for use in producing real time or other graphics presentations such as an interactive video game.

FIG. 2B shows an encoding device 56 and a decoding device 58 each comprising a processing arrangement comprising one or more central processing unit(s) (CPUs) and/or one or more graphics processing unit(s) (GPUs) and/or one or more processing circuit(s). It is advantageous in some use cases for the decoding device 58 to comprise custom-designed hardware such as one or more application specific integrated circuits (ASICs); and for the encoding device 56 to comprise one or more CPU(s) and/or GPUs, one or more non-transitory memory devices storing encoding instructions that are executed by the one or more CPU(s) and/or GPUs. This implementation is not limiting, however. In some use cases, the encoding device 56 and the decoding device 58 may each comprise software stored in non-transitory memory and executing on a processor(s). In other use cases, both the encoding device 56 and the decoding device 58 may comprise hardware circuitry (e.g., comprised of transistor-based logic gates, calculation units, registers and the like) such as provided by one or more ASICs. or other hardware implementations.

In some embodiments, the encoding device 56 and the decoding device 58 are the same device (or are in a common package) that is capable of operating in an encoding mode and in a decoding mode. Implementations typically refer to such devices that can both encode and decode as "codecs". In other embodiments, the encoding device 56 is structured differently from the decoding device 58 so the encoding device 56 only encodes and does not decode, and the decoding device 58 only decodes and does not encode.

Figure 3:
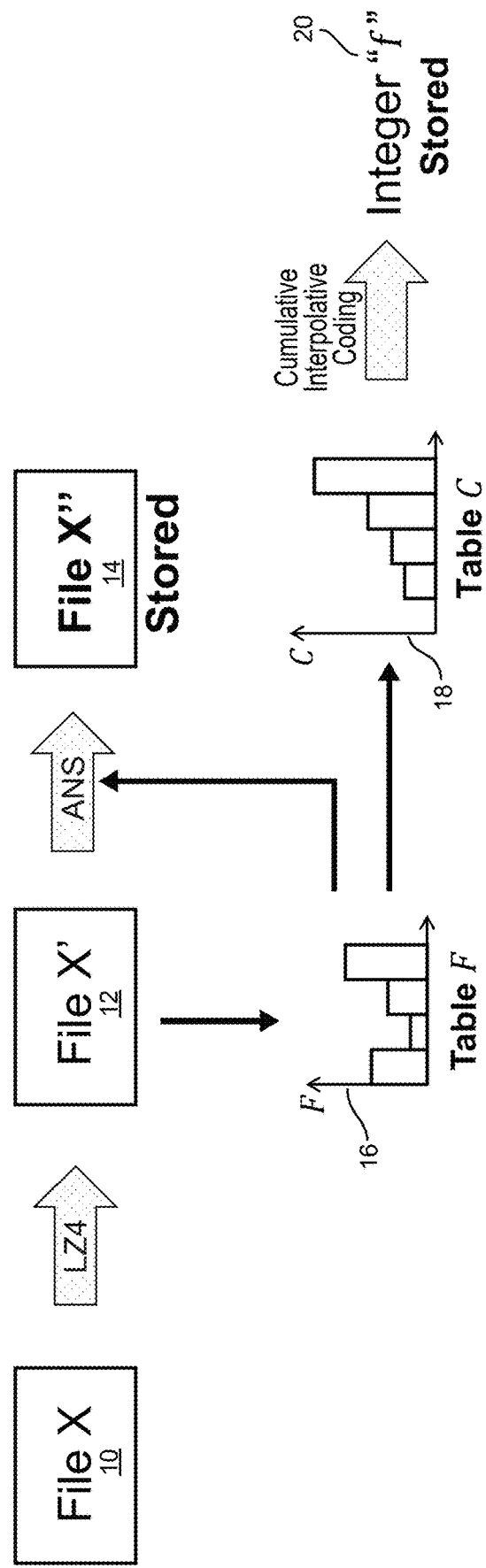
FIG. 3 shows an example new LZ4 compression/ANS entropy encoding process.

As shown in FIG. 3, the encoding device 56 uses both LZ4 compression and ANS entropy encoding to losslessly encode the input file 10 into a compressed, entropy-encoded file 14. That is, in example embodiments, the encoding device may receive the input file already compressed by LZ4 or may compress the file using LZ4 compression. The encoding device 56 then entropy encodes the already-compressed input file, which consists of a sequence of symbols, into corresponding entropy codes. Similarly, the decoding device 58 uses entropy decoding to decode the entropy encoded file 14 to recover the compressed input file which may then be decompressed using LZ4 to recover the original uncompressed input file.

In example embodiments, the codebook or table F 16 used by the encoding device 56 to entropy encode the compressed file and to recover the entropy encoded file, is itself encoded/compressed using a cumulative interpolative encoding technique which may be based for example on "Binary Interpolative Coding" or "BIC". Thus, the encoding device 56 losslessly encodes the codebook or table 16 to produce a compact encoding for communication to the decoding device 58. The decoding device 58 decodes the encoding to recover the codebook or table F which it then uses to decode the entropy-encoded file 14 to recover the original file 10.

Compressing an Entropy Table

Entropy encoding may involve developing a table F (sometimes also called a "codebook") of symbol occurrences. To compress the symbol occurrence table F, the following method (Algorithm 1) may be used:

Calculate a table C (FIG. 3, item 18) of cumulative values of F

Recursively encode the values of table C using a cumulative interpolative coding such as Binary Interpolative Coding ("BIC") to produce an encoding, i.e., a stored integer value f.

More information concerning BIC may be found for example in Moffat et al, Binary Interpolative Coding for Effective Index Compression. Information Retrieval 3, 25-47 (2000). doi.org/10.1023/A:1013002601898, link.springer.com/article/10.1023/A:1013002601898; Turpin et al, Housekeeping for prefix coding, IEEE Transactions on Communications 48(4): 622-628, 48(4): 622-628 (May 2000 DOI:10.1109/26.843129); Moffat et al, Large-Alphabet Semi-Static Entropy Coding Via Asymmetric Numeral Systems, ACM Transactions on Information Systems 38(4) May 2020 DOI:10.1145/3397175; Trotman, "Compressing Inverted Files", Information Retrieval 6, 5-19 (2003).

In the example implementation shown in FIG. 3, encoding of table C (and therefore of table F) is represented by an integer f (20). The integer value f thus constitutes an encoding of the table of symbol occurrences F. This integer f can become very large and as in the general case we do not know its size in advance, we do not know the amount of memory necessary to store it. To overcome this problem, we can in one embodiment use a "bignum" structure (//en.wikipedia.org/wiki/Arbitrary-precision_arithmetic) that can represent arbitrary-precision integers (other embodiments can use other alternative representations). At each decoding step, dividing the bignum actually implies multiple divisions. For example, if at some point the bignum is represented by n 32-bit values, we have to do n divisions. To allow a faster and more memory-efficient decoding, we can add a "renormalization" step to each encoding and decoding step. Renormalization keeps the encoding value in a small manageable range during all the encoding/decoding process to avoid performing arithmetic operations on an extremely large integer. To keep this integer value in a small range, the idea is to write its least significant bits to a buffer every time the integer value exceeds a threshold at encoding. Then, at each decoding step, we just need to compute a single division on a relatively small integer (and potentially read bits from the buffer) instead of computing either a division on a very large integer or multiple divisions on small integers when using a bignum structure. Emitting bits early like this can slightly hurt the compression ratio but this is generally negligible compared to its speed and memory efficiency. Renormalization is often used to improve ANS coding (graphallthethings.com/posts/streaming-ans-explained/#:~:text=Streaming%20and%20normalization). Using such renormalization makes the calculations more efficient for some embodiments, but other implementations may instead use repetitive divisions at each step (e.g., if speed is not an issue or in fast hardware implementations).

Moreover, we make some assumptions in this example non-limiting implementation:

the symbols of the sequence are encoded as 8-bit symbols, so the table F (16) contains 256 elements. The proposed implementation can trivially be generalized to a table with $2^k$ (k>0) elements, k being the symbol size (in bits), or to an arbitrary-size table with slight modifications or by padding it with zero values at the beginning to get back the power-of-2 case.

the number of symbols m in the sequence, that is the total number of occurrences in the table F (16) and the last value in the table C (18), is known at decoding and provided to the decoder, so there is no need to encode it. This is a fair assumption for most practical use cases where the data file or message being encoded is predetermined and not randomly generated in real time as it is being encoded, especially because an entropy encoder such as ANS already needs this value to initialize the decoding. More precisely, as the number of symbols m is necessary to decompress the compressed file, it is stored in the compressed file. Therefore, the ANS decoder and the interpolative decoder both retrieve the value when receiving the compressed file which contains it. This value can then be used by the interpolative decoder as the last value in the table C. In non-limiting implementation, this value is stored in header metadata preceding the encoding f of the table symbol occurrences. For example, in FIGS. 12A-12B, each "Segment Data" (616, 618) is composed of the entropy encoding s of a symbol sequence and the interpolative encoding f of the corresponding table of symbol occurrences used for the entropy encoding, and it is preceded by a segment header (608) which contains metadata necessary to decode the segment data. In this example file format, the number of symbols m (which is used as input integer value m in the interpolative decoder) is stored in the segment header (608) as "[u8] Raw data size". In another implementation, the number may be sent to the interpolative decoder in a different way such as together with the encoding of the symbol occurrence table.

The following algorithms are described using Python-oriented pseudo-code. In particular, when defining a function inside another function, as we do in Algorithm 1 and Algorithm 2, the inner function has access to the variables of the outer function as if they were "global" variables. We want all the calls to the recursive function to increment the same encoding, as if it was "shared" by all of them. The implementation may differ for each programming language. For example, in C or C++, the algorithm could be implemented using two independent functions and pointers to the table C and the encoding f.

Algorithm 1. Cumulative Interpolative Encoding
(Recursive Embodiment)

Function InterpolativeEncode(F)
  input:
    F: array of 256 integer values $F_0, \ldots, F_{255}$
      containing the symbol occurrences
  f=0
  C: array of 257 zero values $C_0, \ldots, C_{256}$
  $C_1 = F_0$
  for i=2, ..., 256

$C_i = C_{i-1} + F_{i-1}$ function InterpolativeEncodeRec($i_{min}$, $i_{max}$)
    input:
      $i_{min}$: first index of the range
      $i_{max}$: last index of the range
    if $C_{i_{min}} \neq C_{i_{max}}$ $i = (i_{min} + i_{max})/2$ if $i_{max} - i_{min} > 2$
        InterpolativeEncodeRec(i, $i_{max}$)
        InterpolativeEncodeRec($i_{min}$, i)

$f = f \times (C_{i_{max}} - C_{i_{min}} + 1) + (C_i - C_{i_{min}})$

InterpolativeEncodeRec(0, 256)
  output: f

Algorithm 2. Cumulative Interpolative Decoding
(Recursive Embodiment)

function InterpolativeDecode(f, m)
  input:
    f: encoding of the symbol occurrence table, computed with Algorithm 1
    m: last entry of the cumulative table of symbol occurrences
  F: array of 256 zero values $F_0, \ldots, F_{255}$
  C: array of 257 zero values $C_0, \ldots, C_{256}$
  $C_{256} = m$
  function InterpolativeDecodeRec($i_{min}$, $i_{max}$)
    input:
      $i_{min}$: first index of the range
      $i_{max}$: last index of the range
    if $C_{i_{min}} \neq C_{i_{max}}$ $i = (i_{min} + i_{max})/2$ $C_i = C_{i_{min}} + f \bmod (C_{i_{max}} - C_{i_{min}} + 1)$ $f = f \operatorname{div} (C_{i_{max}} - C_{i_{min}} + 1)$ if $i_{max} - i_{min} > 2$
      InterpolativeDecodeRec($i_{min}$, i)
      InterpolativeDecodeRec(i, $i_{max}$)
    else
      for $i = i_{min}+1, \ldots, i_{max}-1$ $C_i = C_{i_{min}}$ InterpolativeDecodeRec(0, 256)
  for i=0, ..., 255

$F_i = C_{i+1} - C_i$ output: F

Note:

As one can see from the above, at each encoding step, the example embodiment updates f from the entries in the cumulative table (which encodes the middle entry). The example embodiment does not need to generate any entry, it only updates the integer f. An example embodiment encoding process thus, for each encoding step, calculates, from the cumulative table of symbol occurrences, f×(an entry at a last index−an entry at a first index+1)+(an entry at the middle index−the entry at the first index) to encode the entry at the middle index and update f.

This is unlike decoding where the example embodiment performs first and second operations at each decoding step to generate an entry and update f, namely: (1) calculates, from a partly decoded cumulative table of symbol occurrences, an entry at a first index+f mod(an entry at a last index−the entry at the first index+1) to decode an entry at the middle index of the decoding range, and (2) calculates f div(the entry at the last index−the entry at the first index+1) to update f.

Example

FIG. 4 shows example encoding and decoding of a table C calculating from an example table F of size 4 with m=10. As the value 10 is supposed to be known at decoding, we just need to encode the three values smaller than 10. A naive encoding would encode each of these three values on $\lceil \log_2(10) \rceil = 4$ bits (with $\lceil \cdot \rceil$ the ceiling function see en.wikipedia.org/wiki/Floor_and_ceiling_functions), which makes a total of 3× 4=12 bits for the encoding of the table C. But as FIG. 1 shows, the example method progressively, sequentially (e.g., iteratively in one example embodiment) encodes these three values into a sequence of intermediate representations resulting in an integer f=147, which means the table C is encoded on $\lceil \log_2(147) \rceil = 8$ bits.

In more detail, FIG. 4 shows an example encoding process used to encode an input file table F representation 102 shown here as a histogram with an array of values $F_0$, $F_1$, $F_2$, $F_3$ having respective integer number of occurrences of 3, 1, 2, 4, . . . .

A C array 104 of 257 zero values is defined as described above where $C_1 = F_0$, $C_i = C_{i-1} + F_{i-1}$, etc. $i_{min}$ is defined as the first index of the range and $i_{max}$ is defined as the last index of the range.

Because the value 10 is known at decoding, only the three values less than 10 are encoded. See 106. An interpolative encoding technique such as BIC is used in three iterations as operations on table C to encode the three values as a single encoding integer 147:0

0×(6+1)+2=2 (calculation step 110)

2×(4+1)+3=13 (calculation step 112)

13×(10+1)+4=147 (calculation step 114)

On the righthand side of FIG. 1, the decoding process starts out knowing the value 10 (see array 116) and receives the value 147. The decoding process then performs these decoding steps to reconstruct each intermediate table C shown on the left:

147 mod(10+1)=4 (decoding step 116a) to yield
      array 118 matching defined portions of intermediate array 104

147 div(10+1)=13 (decoding step 118a)

13 mod(4+1)=3 (decoding step 118b) to yield array
      120 matching defined portions of intermediate C array 106

13 div(4+1)=2 (decoding step 120a)

2 mod(6+1)=2 (decoding step 120b) to yield array
      122 matching defined portions of intermediate C array 208

2 div(6+1)=0 (decoding step 122a) to yield array
124 that exactly matches original F array 102
(i.e., the original occurrence frequency array is
recovered without loss)

In the above example, encoding is dynamic/adaptive in that the f calculation below (please note this is one for encoder) is changeable for each calculation:

$$f=f\times(C_{i_{max}}-C_{i_{min}}+1)+(C_i-C_{i_{min}})$$

For reference, you can see this in FIG. 4 showing the change of "6"→"4"→"10" (the reverse order for decoding). This calculation thus provides (in the decoder) arithmetically dividing the received integer value by a dynamically changing value to derive a series of remainders. This can also be described as changing value according to the maximum and the minimum in the target range of calculation.

As another aspect, while the algorithms described above are recursive and perform iteratively, such recursive program codes are sophisticated (compact and efficient) but can alternatively be performed by an implementation like coding each calculation one by one, i.e., "in sequence" or by "(plural) sequential calculations" for example using inline code rather than looping or recursion (i.e., a function that calls itself). Hardware implementations meanwhile can pass data in multiple passes through the same circuits, or provide a series or sequence of calculation circuits such as in a pipelined fashion, or both.

Example: Compressing a Sequence of Symbols

Figure 5A:
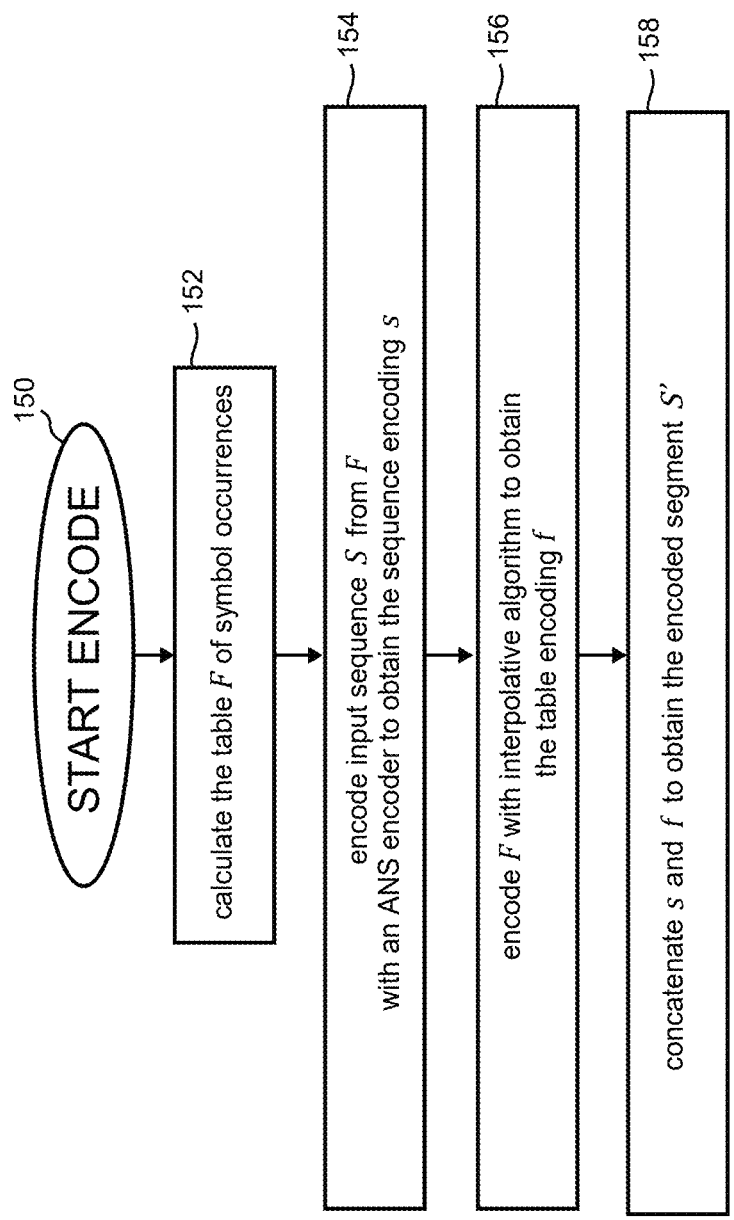
FIG. 5A shows an example sequence of encoding steps.

To compress a sequence of symbols (e.g. a file), one just needs to integrate these algorithms in the ANS encoding/decoding described above:

Algorithm 3. Sequence Encoding input:
　S: arbitrary-size sequence of symbols
calculate the table F of symbol occurrences (FIG. 5A, block 152)
encode S from F with an ANS encoder to obtain the sequence encoding s (FIG. 5A, block 154)
encode F with Algorithm 1 to obtain the table encoding f (FIG. 5A, block 156)
concatenate s and f to obtain the encoded segment S' (FIG. 5A, block 158)
output: S'

Figure 5B:
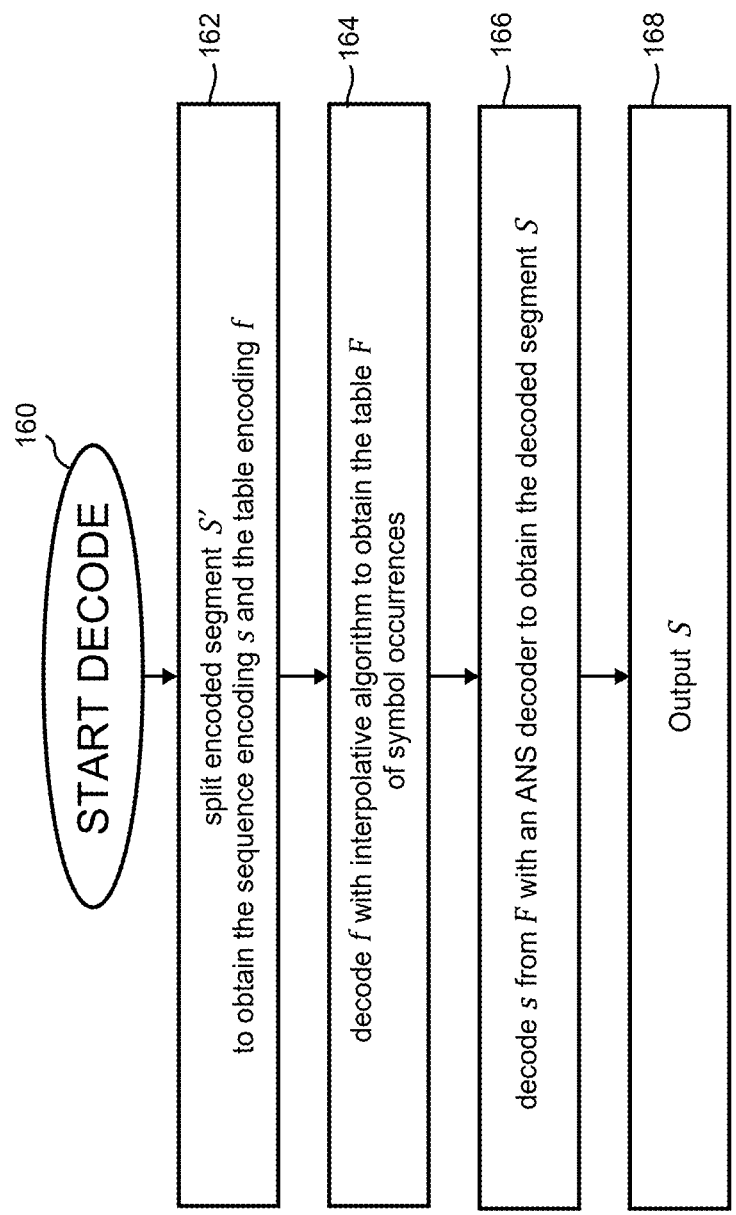
FIG. 5B shows an example sequence of decoding steps.

Algorithm 4. Sequence Decoding input:
　S': arbitrary-size sequence encoded with Algorithm 5
split S' to obtain the sequence encoding s and the table encoding f (FIG. 5B, block 162)
decode f with Algorithm 2 to obtain the table F of symbol occurrences (FIG. 5B, block 164
decode s from F with an ANS decoder to obtain the decoded segment S (FIG. 5B, block 166)
output: S (FIG. 5B, block 168)

Figure 5C:
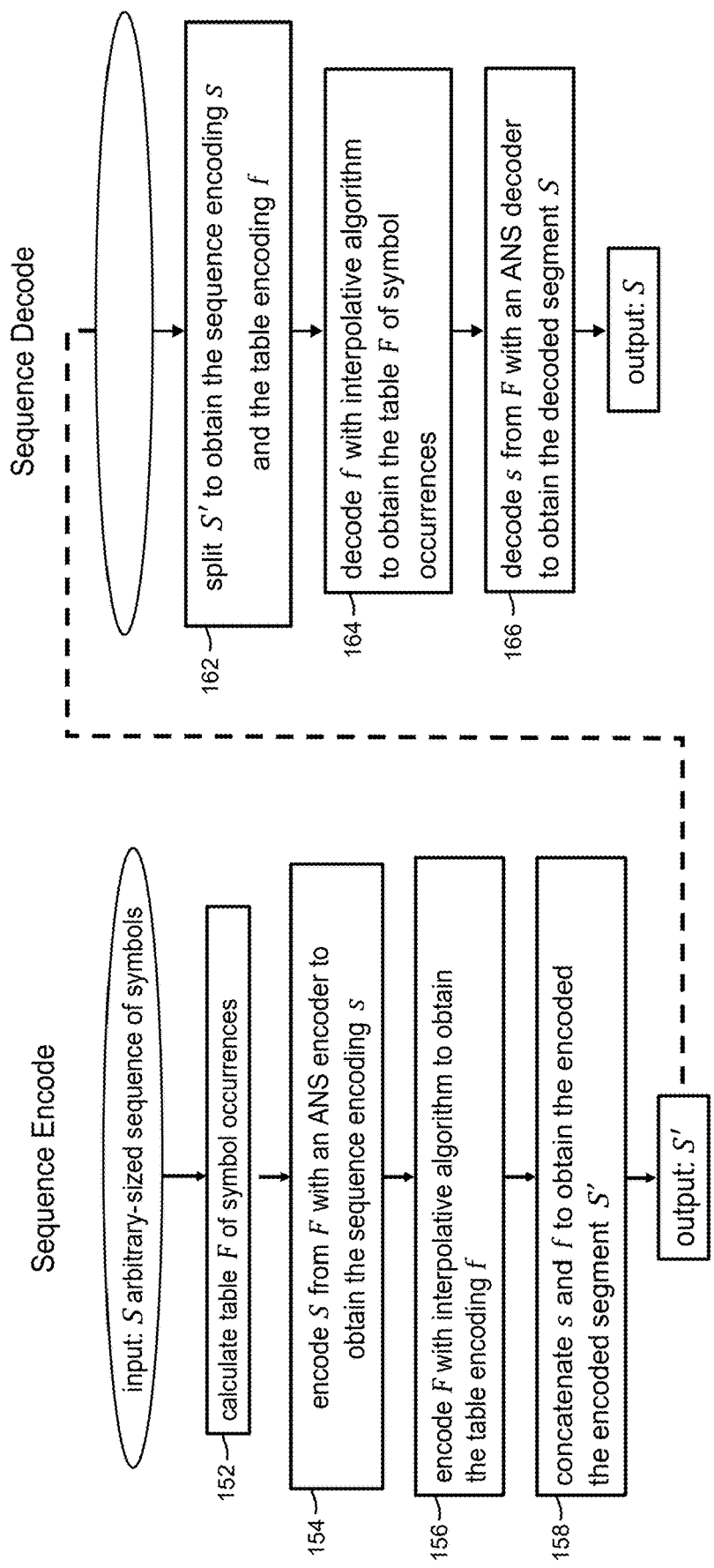
FIG. 5C shows example encoding and decoding steps.
Figure 6:
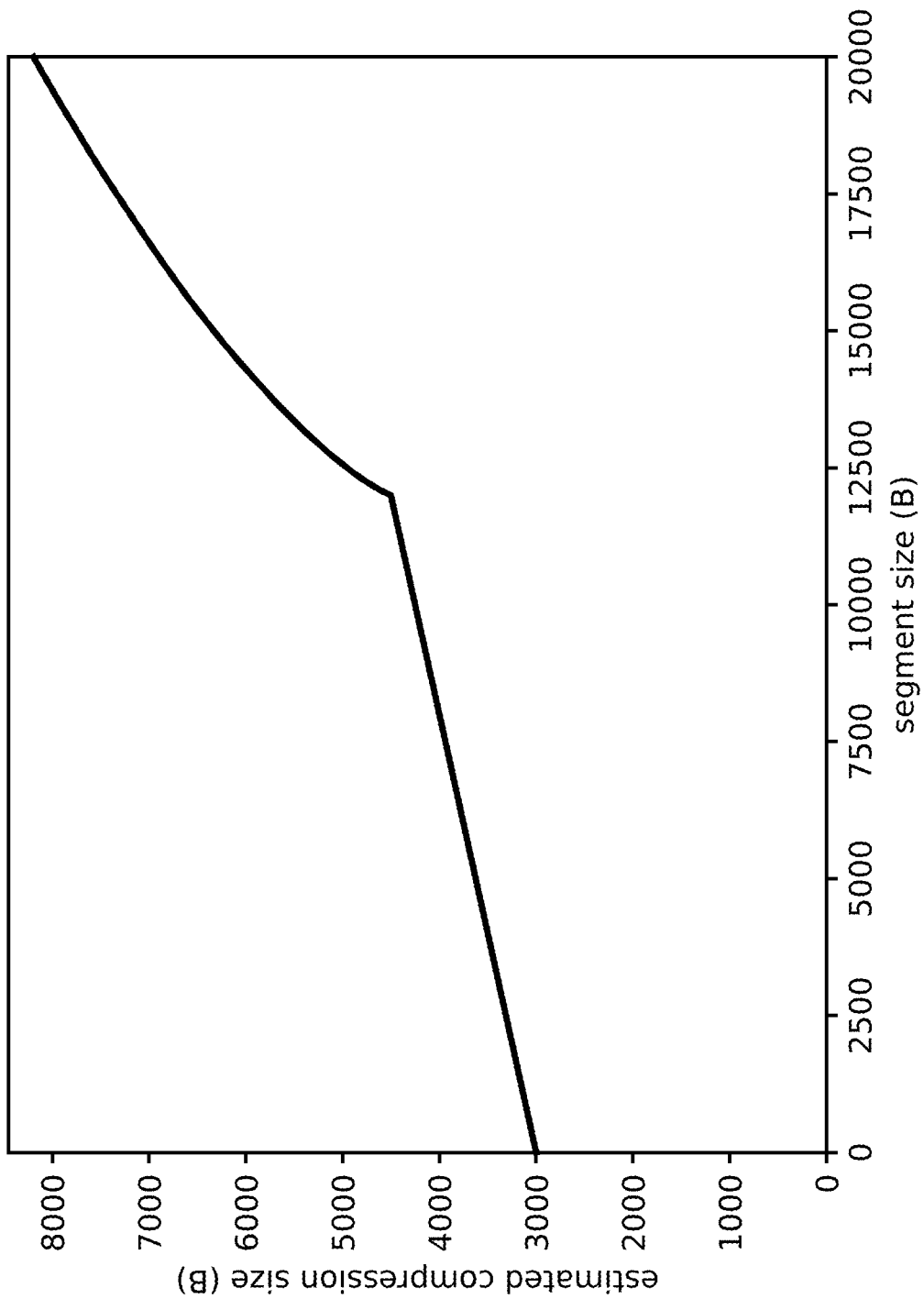
FIG. 6 shows an example forward pass to estimate the compression size of the left-child segment.
Figure 7:
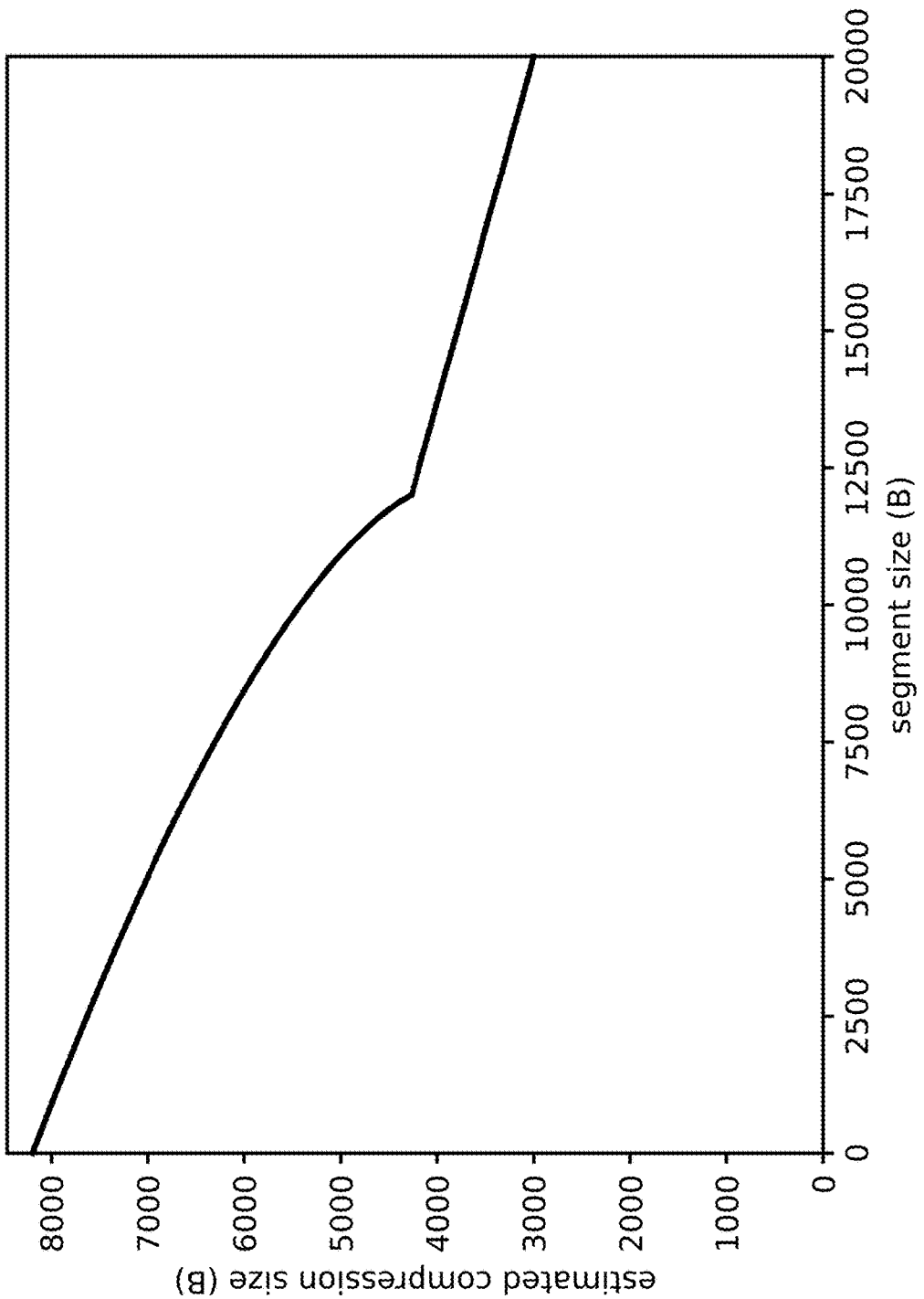
FIG. 7 shows an example backward pass to estimate the compression size of the right-child segment.
Figure 8:
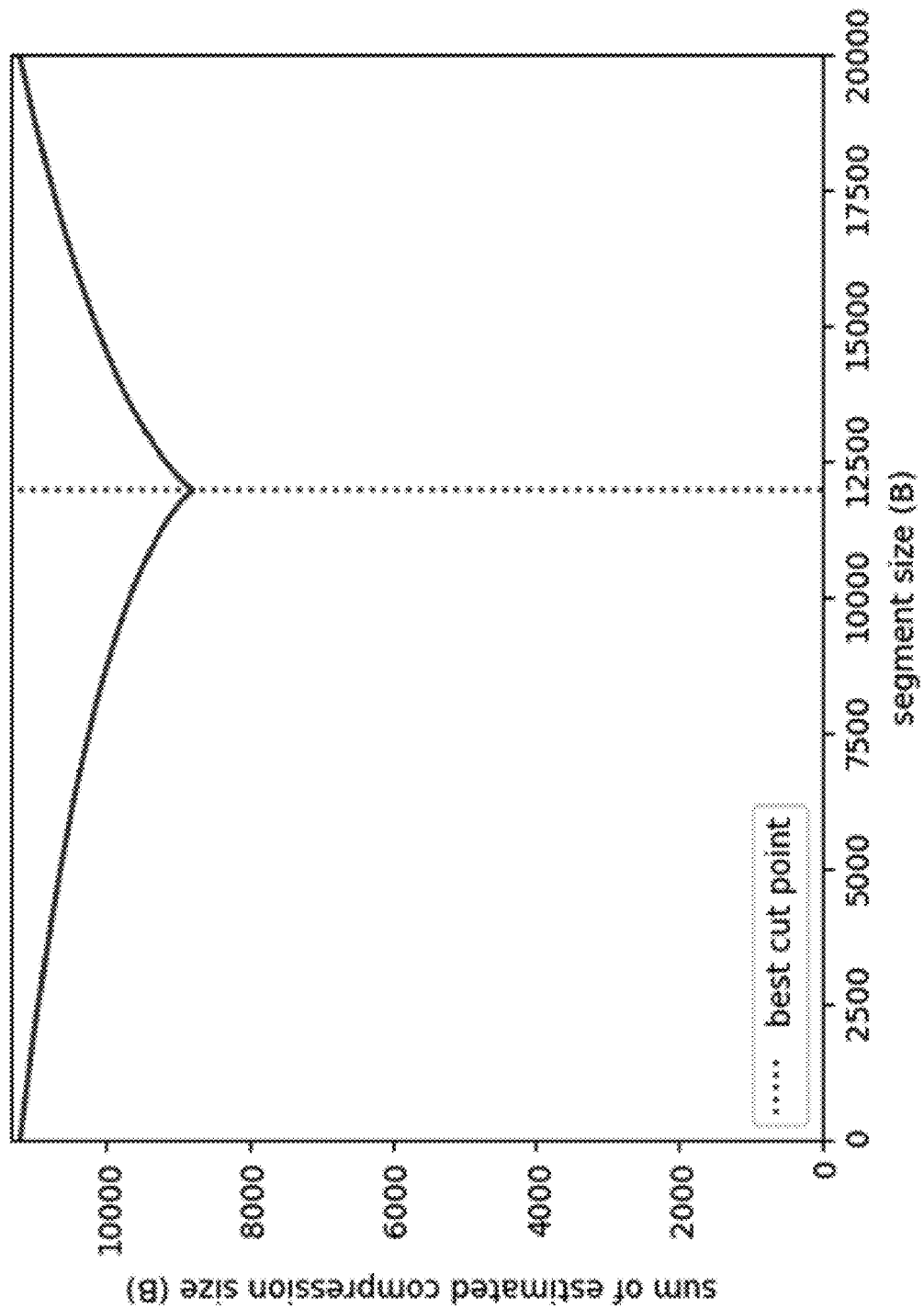
FIG. 8 shows an example sum of the estimated compression sizes of the two child segments. The index of the minimum of this sum represents the best potential cut point.
Figure 9:
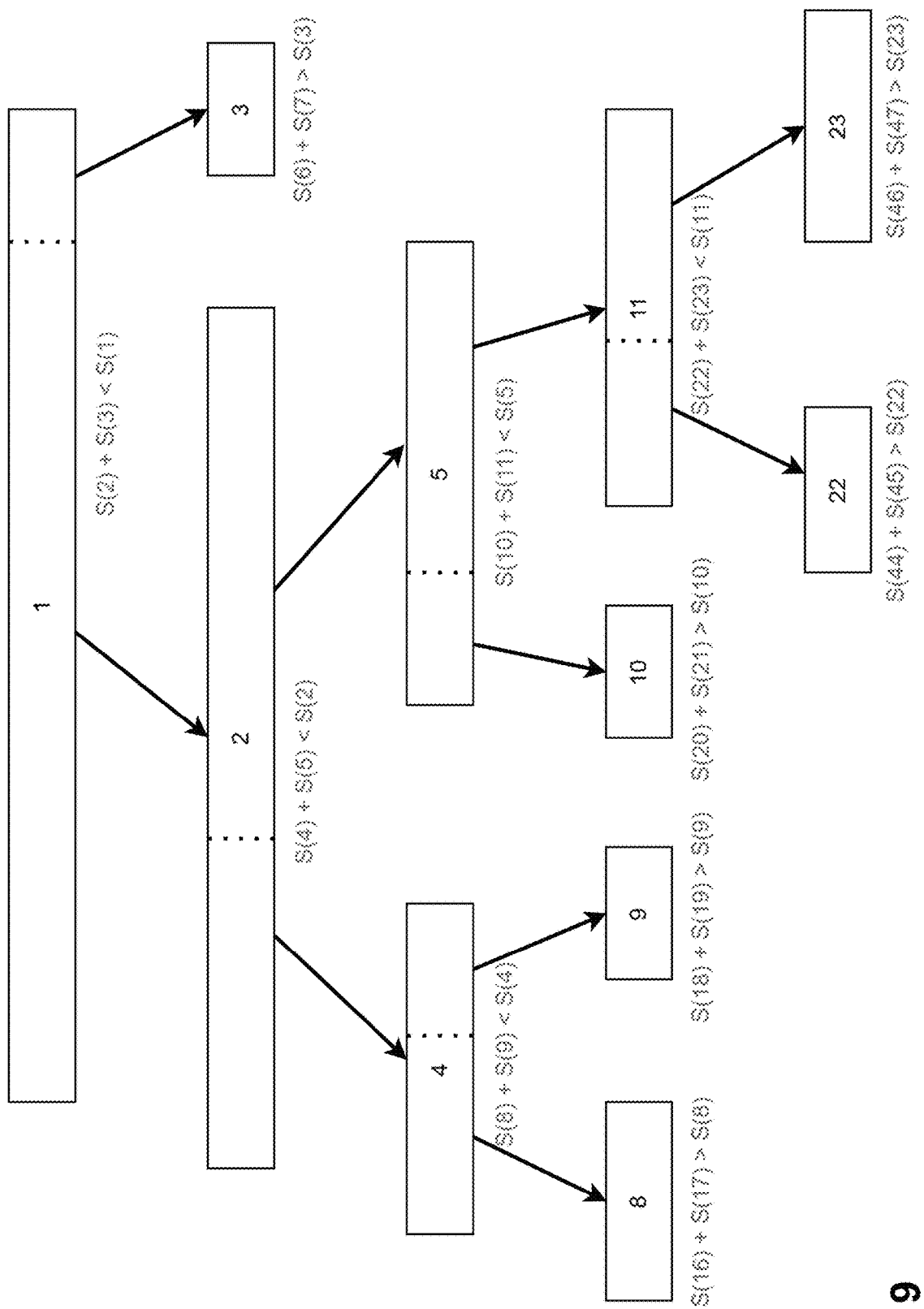
FIG. 9 schematically shows a segmentation example where each rectangle represents a segment of the sequence. S(n) is the estimated compression size of the segment of index n, calculated as the sum of its order-0 entropy and the size of its compressed byte occurrence table.

FIG. 5C summarizes overall example encoding and decoding steps which can be performed by the same component operated by the same party, or by the same components operated by different parties, or by different components operated by different parties. In this example, the table F encoding and table F decoding steps are characterized as a "cumulative interpolative algorithm" that in particular embodiments may or may not be what one skilled in the art would call or refer to as "Binary Interpolative Coding" or BIC.

Example Binary Segmentation

If the symbol distribution varies a lot within the sequence, splitting the sequence into several segments with homogeneous distributions and compressing these segments independently can result in a better compression ratio. To do this, we slice the sequence where a significative change in distribution is observed. Detecting such a "change point" in the probability distribution of a stochastic process (a sequence of random variables) is a well-known problem called change point detection. See e.g., en.wikipedia.org/wiki/Change_detection. Here we propose a custom greedy algorithm using a top-down binary segmentation.

Our segmentation algorithm seeks to split a sequence into two segments if the sum of the estimated compression sizes of the two segments is smaller than the estimated compression size of the sequence. To do so, we iterate through the sequence and, for each symbol added, calculate the (order-0) entropy of the underlying segment. This gives us, for each symbol, the estimated compression size of the first of the two segments (left child segment) if we decided to cut the sequence at this location. In practice, we perform this evaluation every N symbols to reduce calculation time.

To estimate the compression size of the second segment (right child segment), we perform the same calculations by traversing the sequence in reverse. The entropy of a sequence, calculated from the occurrences of symbols, is the same regardless of the iteration direction. Then we simply add the two estimates obtained at each symbol and select the cut point where the sum is minimum.

Once the cut point is found, we compare the sum of the compression sizes of the two resulting child segments with the compression size of the parent segment using the presented compression method. To do so, we do not need to actually compress the segments. The (order-0) entropy is almost an exact estimation of the compression size of a sequence using an ANS encoder with an occurrence frequency table as a two-part code but without including the storage size of the ANS table itself. Therefore, we just need to compress the ANS table, already computed to calculate the entropy, with the cumulative interpolative algorithm and sum its size after compression with the entropy of the segment to obtain the compression size of the segment. Then, if the sum of the compression sizes of the child segments is smaller than the compression size of the parent segment, we perform the segmentation; otherwise we do not.

If the segmentation occurred, the same algorithm is applied recursively on the two child segments, which gradually builds a segment tree. See e.g., en.wikipedia.org/wiki/Segment_tree. At the end of the algorithm, we simply take the leaf segments in the segment tree. As we cut a node segment only if it is profitable, the leaf segments represent the best segmentation provided by the algorithm in the segment tree such as shown in FIG. 5.

FIGS. 6, 7, 8, 9 show an example of finding a cut point in a sequence of bytes. This sequence was generated by concatenating two sequences that were each generated by drawing bytes randomly according to two distinct Gaussian distributions. The first has a size of 12000 bytes, the second 8000 bytes. The sequence therefore has a size of 20000 bytes with a change in distribution around the 12000th byte. As we can see below, the algorithm clearly identifies a cut point around the 12000th byte.

When segmenting the sequence of symbols with this binary segmentation, the compression and decompression algorithms of the sequence therefore become as follows:

Algorithm 5. Sequence Encoding with Segmentation input:
S: arbitrary-size sequence of symbols
segment S using Binary segmentation to obtain segments $(S_i)_{i=1, \ldots, N}$
for each segment $S_i$:
    encode $S_i$ with Algorithm 3 to obtain the encoded segment $S'_i$
concatenate encoded segments $(S'_i)_{i=1, \ldots, N}$ to obtain the encoded sequence S'
output: S'

Algorithm 6. Sequence Decoding with Segmentation input:
S': arbitrary-size sequence encoded with Algorithm 5
split S' to obtain encoded segments $(S'_i)_{i=1, \ldots, N}$
for each encoded segment $S'_i$:
    decode $S'_i$ with Algorithm 4 to obtain the decoded segment $S_i$
concatenate decoded segments $(S_i)_{i=1, \ldots, N}$ to obtain the decoded sequence S
output: S In Algorithm 5, the concatenation of the encoded segments involves storing one or multiple specific headers allowing splitting of the encoded sequence into encoded segments at decoding. This is an implementation detail and there are several ways to do this.

As noted above, most of the segmentation work is performed on the encoder side. However, the decoder is also "aware" it is operating on segments at least because it concatenates the decoded segments together in a proper order into a sequential file or stream.

Compression of LZ4 Blocks

We propose to apply the aforementioned compression method over LZ4 compression. As explained in LZ4 at documentation github.com/lz4/lz4/blob/dev/doc/lz4_Block_format.md and shown schematically in FIG. 10, 10A, an LZ4 compressed block is composed of "sequences" where each sequence is in turn composed of five streams called:
token,
literal length,
literals,
offset, and
match length.

These streams are described in detail in the LZ4 documentation and a blog post "LZ4 explained." (fastcompression.blogspot.com/2011/05/lz4-explained.html). As an LZ4 block is composed of many such sequences, we group the different streams of all the block sequences into five groups. Then, for each group, we concatenate its streams into a single sequence that we compress using Algorithm 5 above. Depending on the size of each group of streams, one can choose to compress only some of them.

This method allows a much better compression ratio than a LZ4 alone (21.2%+/−2.5% additional compression according to our experiments) while still allowing a fast decompression.

Figure 12A:
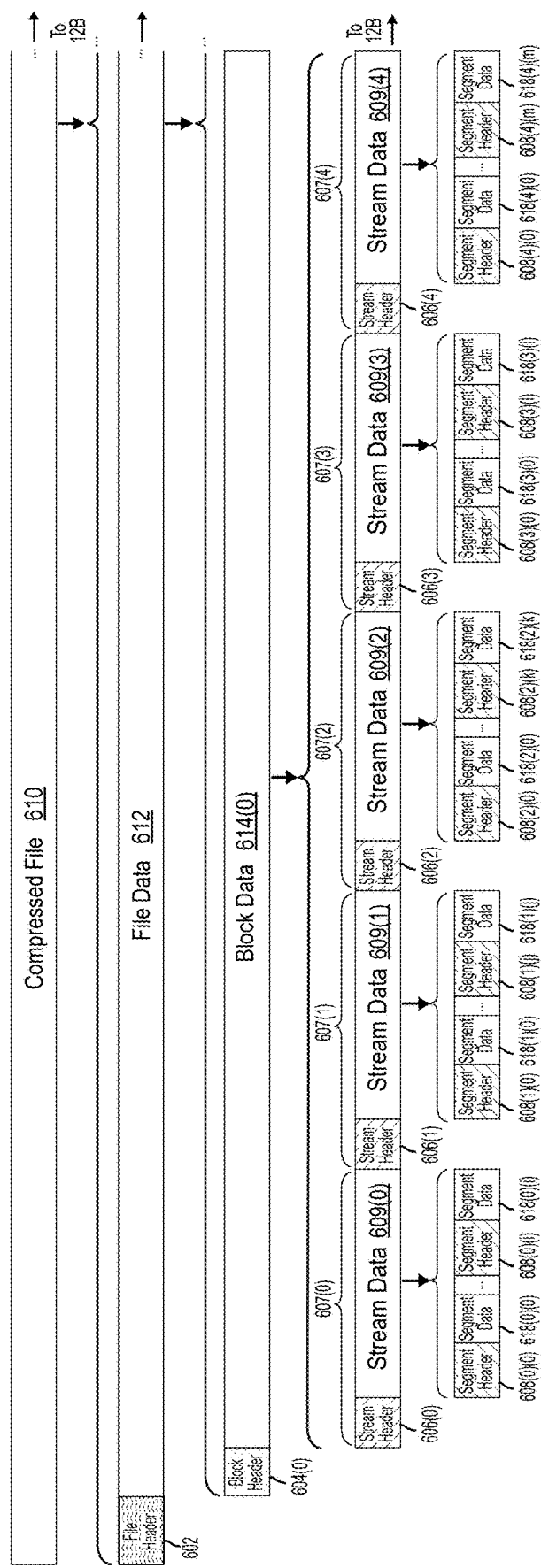
FIGS. 12A-12B are together a schematic diagrams of an example compressed file format.
Figure 12B:
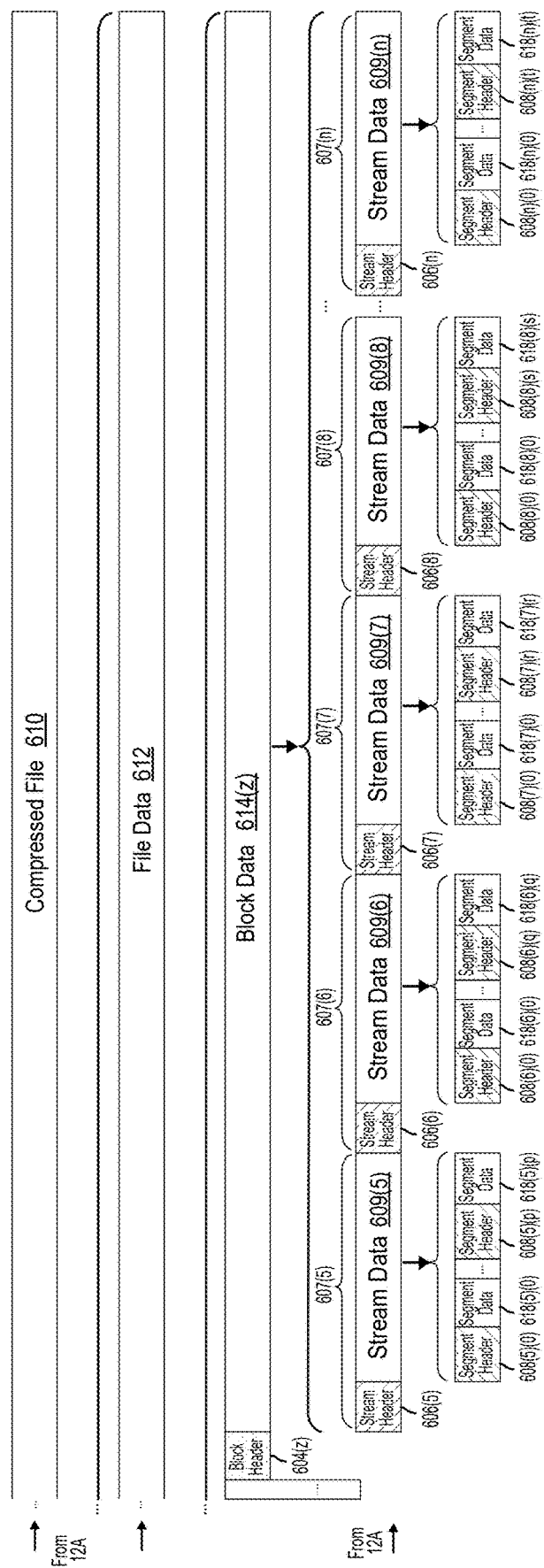

FIG. 11 is an overview of an example algorithm to encode an LZ4 block. The figure also describes all the encoding algorithms described above. In this example, the file X 502 is analyzed by a processor using a conventional LZ4 encoder 504 to produce an LZ4 block 506 comprising a plurality of LZ4 sequences and generating a plurality of files 508A, 508B, 508C 508D, 508E. Each one of these files 508 is operated on by Algorithm 5 which segments the file as described above into segmented files 512. Thereby a plurality of files 512(S1) to 512(Sn) are generated for each of 508A, 508B, 508C 508D, 508E. Each one of the segmented files 512(S1) to 512(Sn) is operated on by Algorithm 3 using ANS entropy encoding to produce an entropy encoding (integer $s_i$ 514), and Algorithm 1 operates on the symbol occurrence table F of the entropy-encoded segmented file as described above using interpolative coding to produce an integer $f_i$. Algorithm 3 also concatenates the integer $s_i$ and the integer $f_i$ to produce File $S'_i$. Then the plurality of files from File $S'_1$ 516(S'1) to File $S'_n$ 516(S'n) are concatenated to a File S' 520 and formatted as shown in FIGS. 12A-12B. Each file from File A' 522A to File E' 522E corresponds to File S' 520 (File S' 520 is used as File A' 522A when File A 508A is operated by Algorithm 5). The resulting respective files 522A-522E are concatenated and stored in a file X' 524 and formatted as shown in FIGS. 12A-12B.

FIGS. 12A-12B show a file format for a compressed file 610. Compressed file 610 is formatted to comprise a hierarchical structure where:
- the compressed file 610 comprises a File Header 602 (see FIG. 12C) concatenated with file data 612;
- the file data 612 comprises one or more blocks each comprising a respective Block Header 604 (see FIG. 12D) concatenated with respective Block Data 614;
- each Block Data 614 comprises one or more Streams 607 each comprising a respective Stream Header 606 (see FIG. 12E) concatenated with respective Stream Data 609; and
- each Stream Data 609 comprises one or more Segments each comprising a respective Segment Header 608 (see FIG. 12F) concatenated with respective Segment Data 618.

In the example shown, there are a plurality of Blocks 614(0), . . . , 614(z). Each Block 614 includes a number of Streams 607. For example, Block 614(0) includes Streams 607(0), . . . 607(4), and Block 614(z) includes Streams 607(5), . . . , 607(n). Blocks 614 can have the same number of Streams 607 or different numbers of Streams.

In the example shown, each Stream 607 comprises a number of Segments, each Segment comprising a respective Segment Header 608 and respective Segment Data 618. For example, Stream 609(0) comprises Segment Header 608(0)(0) and associated Segment Data 618(0)(0), . . . Segment Header 608(0)(i) and associated Segment Data 618(0)(i). Meanwhile, Stream 609(1) comprises Segment Header 608(1)(0) and associated Segment Data 618(1)(0), . . . and Segment Header 608(1)(j) and associated Segment Data 618(1)(j). In the example shown, Stream 609(n) comprises Segment Header 608(n)(0) and associated Segment Data 618(n)(0), . . . and Segment Header 608(n)(t) and associated Segment Data 618(n)(t). The integer values i, j, k, l, m, n, p, q, r, s, t can be the same value or different values.

Each of the Stream Data from File Data 612 in FIGS. 12A-12B correspond to each of the files from File A' 522A to File E' 522E in FIG. 11. The stream data within the streams in turn may include segments 616 each prefixed by a segment header 608. Each of the Segment Data 616a, 616b, 616c, 616d, 616j in FIG. 12A (respectively 618a, 618b, 618c, 618d, 618k in FIG. 12B) corresponds to the File $S'_1$ 516(S'1) in FIG. 11 because there are all the first Segment Data in their Stream Data. File A' to E' actually correspond to each Stream Data.

Example significance of the "u" values shown in the headers of 12C, 12D, 12E and 12F are as follows in example embodiments:

u32: unsigned integer holding 32 bits of data
u8: unsigned integer holding 8 bits of data
u6: unsigned integer holding 6 bits of data
u4: unsigned integer holding 4 bits of data
u2: unsigned integer holding 2 bits of data
[u8]: array of u8 values.

In the stream header 606 shown in FIG. 12E, there are fields "u2 Number of bytes for additional stream size" and "[u8] Additional stream size b6 . . . bN (optional)". Here, if the size (in bytes) of "Stream Data" fits in 6 bits (b0 . . . b5), i.e. a max size of 63 bytes, "[u8] Additional stream size b6 . . . bN (optional)" is empty and "u2 Number of bytes for additional stream size" is 0. If "Stream Data" contains more than 63 bytes (which is very likely), more than 6 bits are used to encode its size. For example, if its size is 100 KB, 17 bits encode this size (log 2(100000)=16.61), that is 11 additional bits, so 2 additional bytes (u8). In this case, "[u8] Additional stream size b6 . . . bN" would contain 2 bytes (b6 . . . b21, a table of 2 u8) and "u2 Number of bytes for additional stream size" would be equal to 2, telling the decoder that it needs to read these 2 additional bytes after "u6 Stream size b0 . . . b5" to get the complete stream size. The decoder will therefore concatenate the first 6 bits (b0 . . . b5) with the next two bytes (b6 . . . b21) to get the stream size (b0 . . . b21 in binary representation, which would represent the integer 100000).

Alternatively to the data format shown in FIGS. 12A/12B, the compressed file is easily "embeddable" in another file without storing some or all of the headers shown. For example, if we want to embed the encoded file in a game compressed file, we need only store the streams, without storing the file header 602, the block header 604, the stream header 606 or the segment header 608.

Figure 13A:
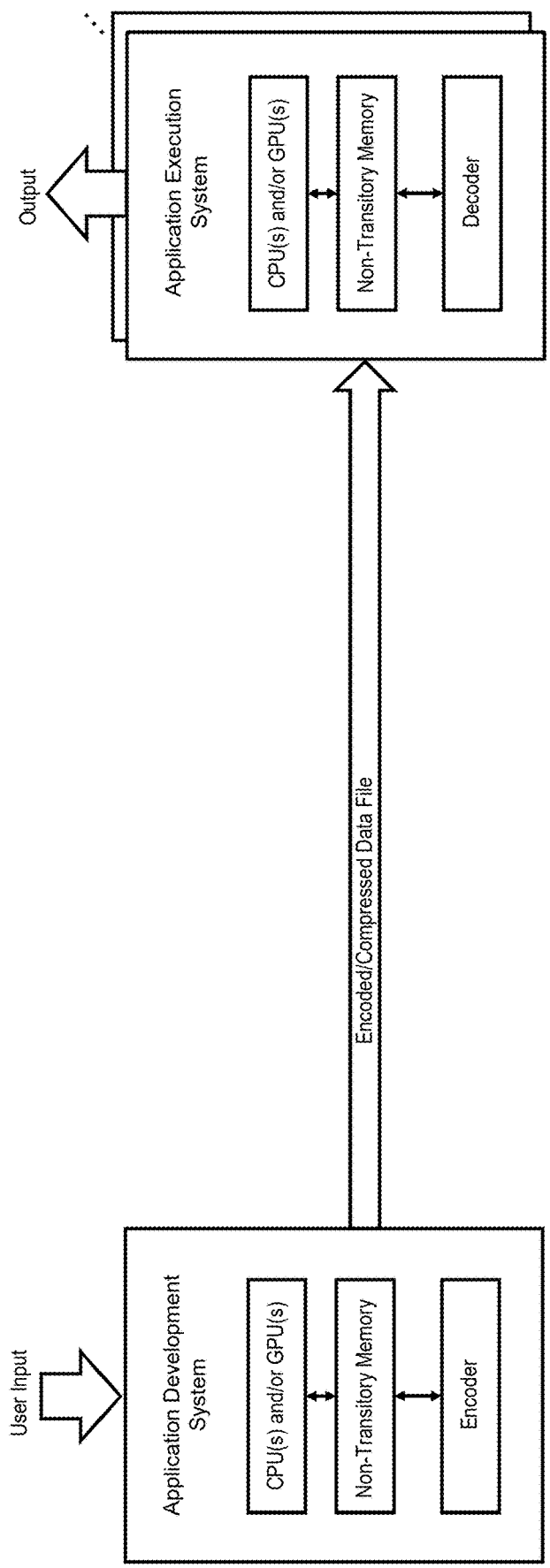
FIGS. 13A-13H show example use cases.
Figure 13B:
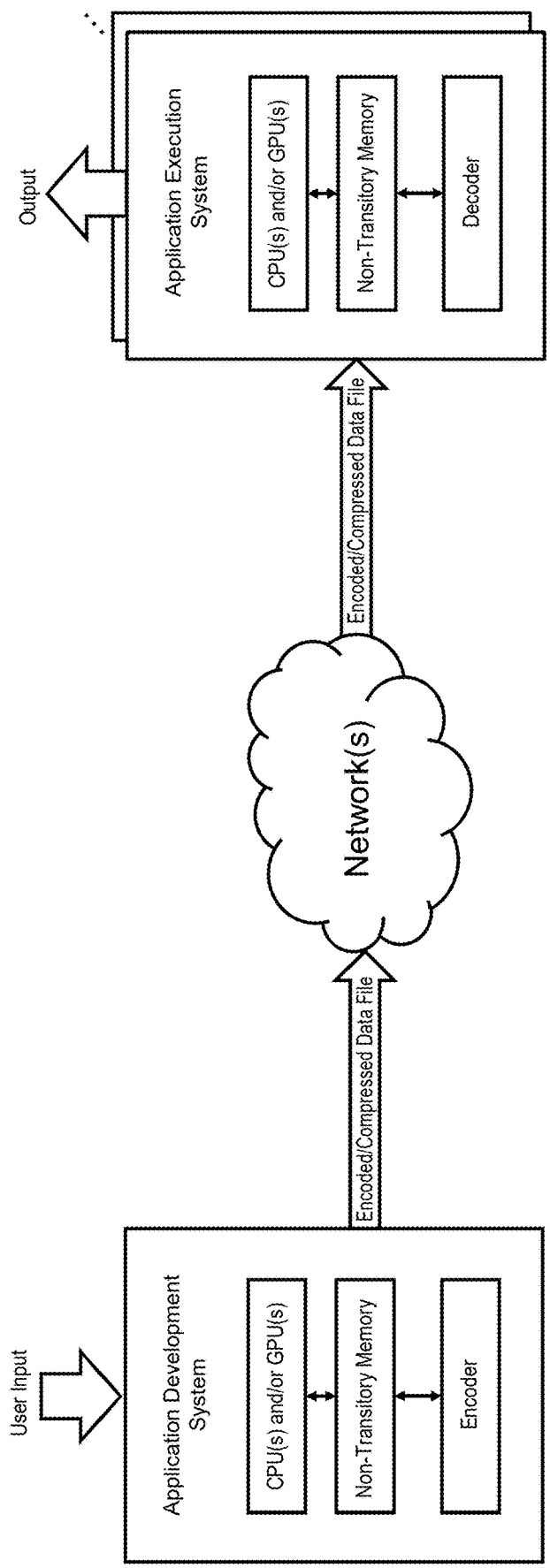
Figure 13C:
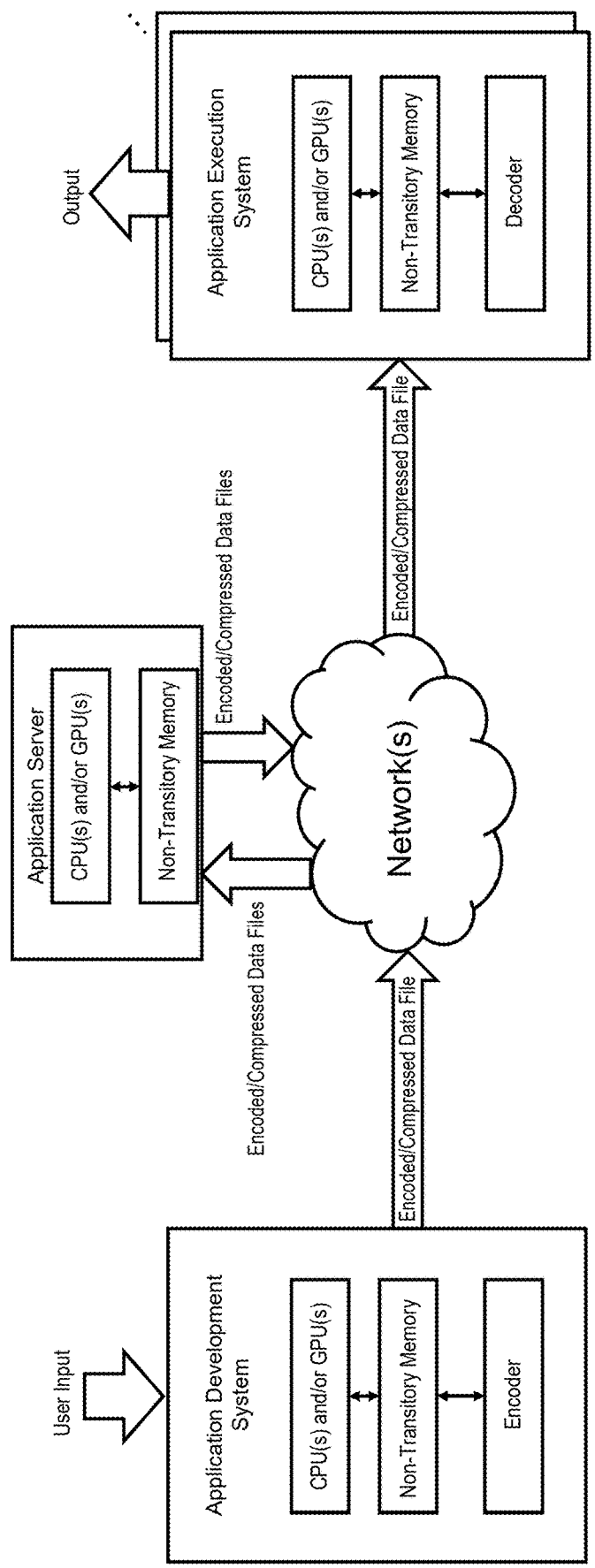
Figure 13D:
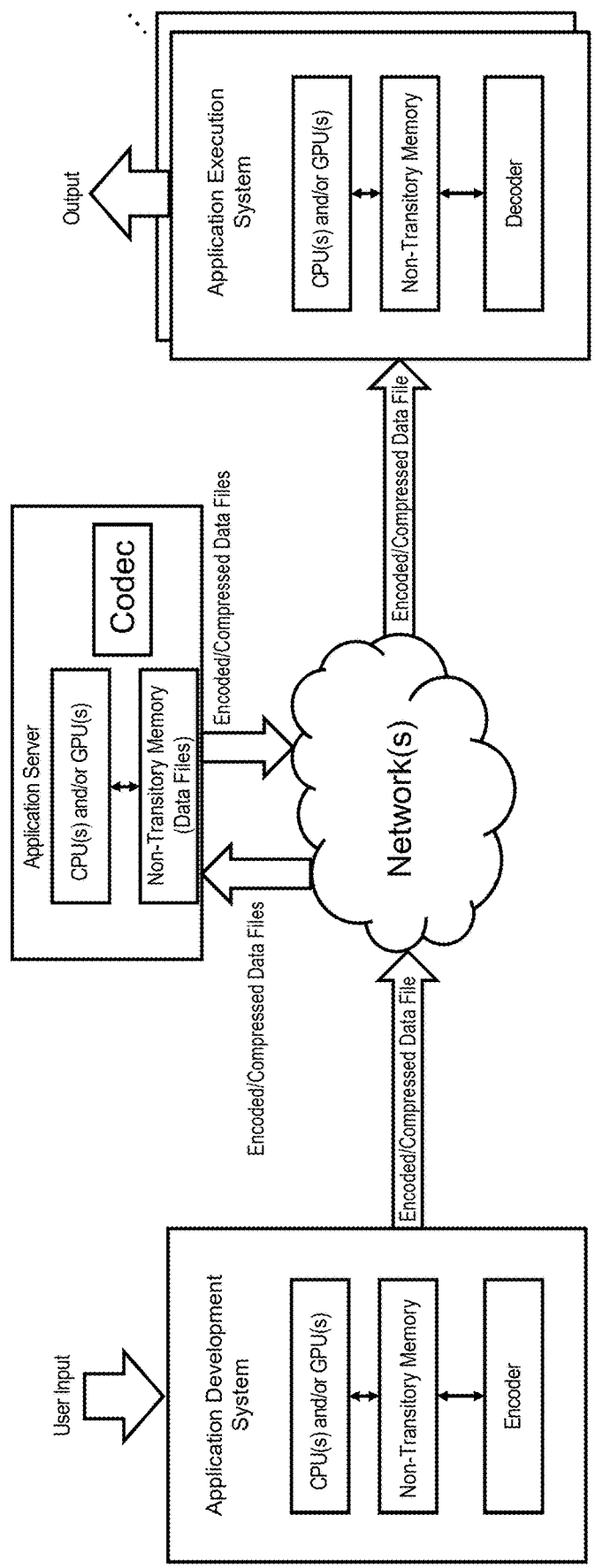
Figure 13E:
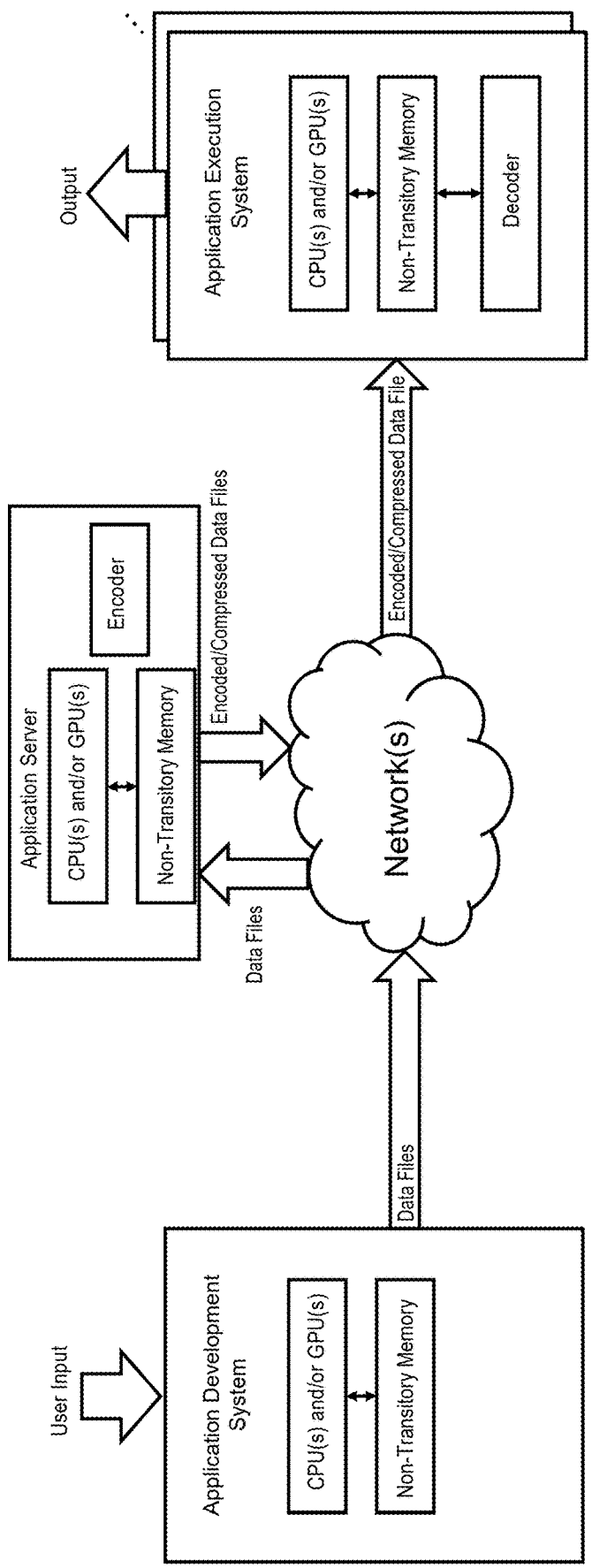
Figure 13F:
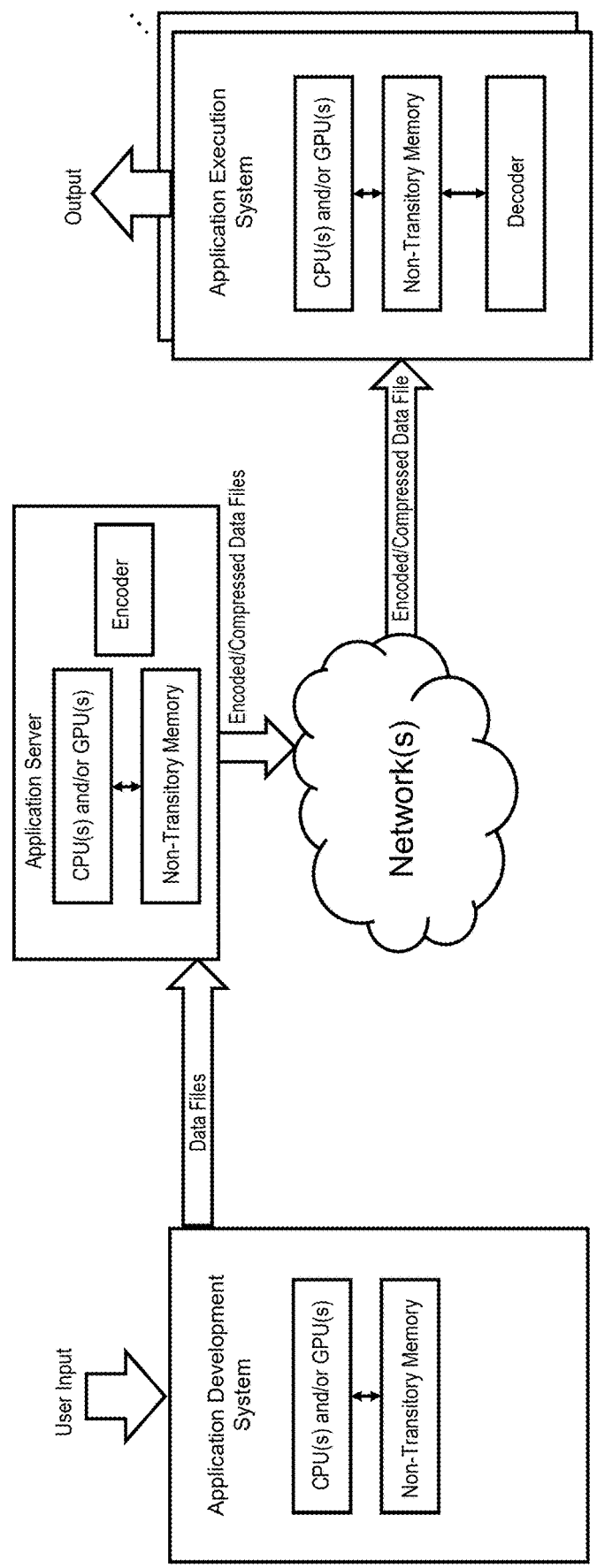
Figure 13G:
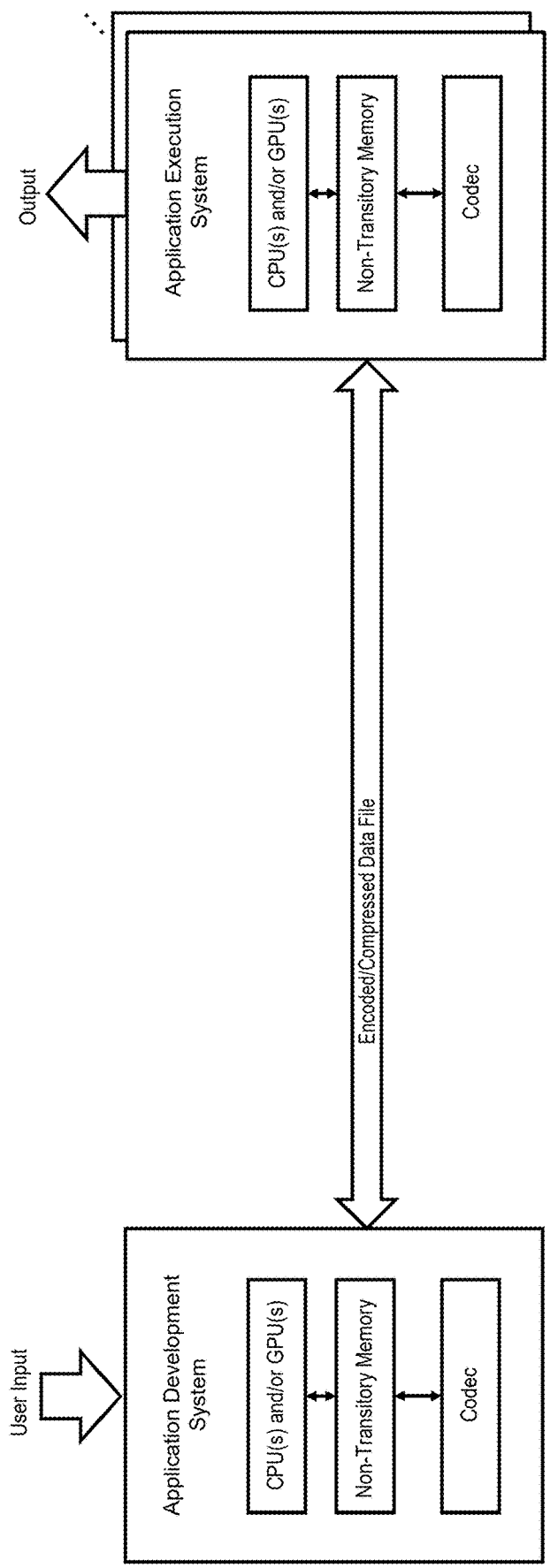

In one embodiment, the formatted data shown may be stored in a non-transitory storage device and communicated from an encoder to a decoder. See e.g., FIG. 13A which shows an example encoding device communicating encoded data sending to an example decoding device over any kind of connection. See also FIG. 13B which shows an example encoding device communicating encoded data to an example decoding device over a network connection. Decoding by the decoder proceeds in the opposite manner and the decoding device can then use the decoded data such as by storing it in at least one non-transitory memory device as computer code or instructions for execution by at least one processor. See also FIG. 13C which shows an intermediate application server that receives encoded compressed data files from an encoding device and provides the encoded compressed data files over a network to one or more application execution systems that each include a decoder for decoding the encoded compressed data files and then using (e.g., executing) the decoded data to produce an output. FIG. 13C shows the intermediate application server is not required to decode the encoded compressed data files but may instead store them "as received" for providing to the application execution server. FIG. 13D meanwhile shows another embodiment where the application server may decode the encoded compressed data file and then re-encode the data to provide an encoded compressed data files to the application execution system. FIG. 13E shows yet another example embodiment wherein the application development system provides the data files over a network to the application server, and the application server encodes the data files and provides the encoded compressed data files to the application execution system such as over a network. FIG. 13F shows yet another example embodiment wherein the application development system provides the data files via a pathway other than over a network to the application server, and the application server encodes the data files and provides the encoded compressed data files to the application execution system such as over a network.

Example I

Decoding Method

In one example embodiment, a decoding method may be performed using at least one processor and/or processing circuit, comprises: receiving an encoded symbol sequence entropy-encoded using a table of symbol occurrences; receiving an integer value f encoding the table of symbol occurrences; using the received integer value f to adaptively decode the table of symbol occurrences, including: (i) decoding each entry of a cumulative table of symbol occurrences by successively subdividing decoding ranges of the cumulative table of symbol occurrences at their respective middle indexes and, for each decoding range: calculating, from decoded entries of the cumulative table of symbol occurrences, an entry at a first index+f mod(an entry at a last index−the entry at the first index+1) to decode an entry at the respective middle index of the decoding range, and calculating f div(the entry at the last index−the entry at the first index+1) to update f; (ii) calculating the table of symbol occurrences from the decoded entries of the cumulative table of symbol occurrences; and applying the decoded table of symbol occurrences to entropy-decode the received encoded symbol sequence.

To clarify, the first reference "a table of symbol occurrences" in the above example refers to table F—not cumulative table C—in the example embodiment described in detail below. Indeed «cumulative interpolative encoding/decoding» in example embodiments includes the conversion between tables F and C (hence the «cumulative» term in the name) which is above described in (ii). So at the end of (i), the example embodiment has decoded table C and then at the end of (ii), the example embodiment has decoded table F; so (i)+(ii) decodes table F. To put it another way:

«Cumulative interpolative decoding» decodes table F by:
i) Decoding table C with «interpolative decoding»
ii) Calculating table F from table C.

In one embodiment, the decoding may further include receiving a second integer value m, using a zero value as a lower bound of the cumulative table of symbol occurrences, and using the received second integer value m as an upper bound of the cumulative table of symbol occurrences.

In one embodiment, the decoding may further include: receiving a second integer value m, inserting a zero value as a first entry of the cumulative table of symbol occurrences, and inserting the received second integer value m as a last entry of the cumulative table of symbol occurrences.

In an embodiment, the received second integer value m may be obtained from a header metadata of the encoded symbol sequence.

In an embodiment, the decoding may further include decoding the entries of the cumulative table by traversing a tree of subdivided decoding ranges and calculating an arithmetic division at each node of the tree before child nodes of said each node. The entries of the cumulative table are decoded by traversing the tree of subdivided decoding ranges in a depth-first pre-order and calculating an arithmetic division at each node of the tree.

In an embodiment, the received integer value f may be represented as a big number (bignum).

In an embodiment, the decoding may further include renormalizing to allow faster and more memory-efficient decoding.

In an embodiment, the encoded symbol sequence may comprise an aggregation of different components comprising token, literal length, literals, offset, and match length, of sequences of an LZ4 block.

In an embodiment, using the received integer value f may consist of using only integer arithmetic, shifts, logic operations, loads and stores to recover entries of the table of symbol occurrences.

In an embodiment, applying may comprise applying Asymmetric Numeral Systems (ANS) entropy decoding to decode the received encoded symbol sequence.

In an embodiment, the decoding may further include iterating or recursing the successively subdividing and the calculating for each decoding range.

In an embodiment, the decoding may further include independently decoding segments of the encoded symbol sequence resulting from entropy-based binary segmentation of the symbol sequence and reconstructing the symbol sequence based on segment headers.

In an embodiment, the decoding may further comprise executing with at least one processor, instructions losslessly recovered by decoding the received entropy-encoded symbol sequence.

In an embodiment, the decoding may further comprise generating with at least one graphics processing unit, at least a portion of an interactive graphical display based at least in part on graphical data losslessly recovered by decoding the received entropy-encoded symbol sequence.

Example II

Decoder

In an embodiment, a decoder may comprise at least one processor and/or processing circuit configured to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences.

In such embodiment:
The operations may further include apply the calculated table of symbol occurrences to entropy-decode an encoded symbol sequence and/or execute at least a portion of the entropy-decoded symbol sequence and/or stream at least a portion of the entropy-decoded symbol sequence.
The operations may further comprise: receiving a second integer value m, using a zero value as a lower bound of the cumulative table of symbol occurrences, and using the received second integer value m as an upper bound of the cumulative table of symbol occurrences.
The operations may further comprise: receiving a second integer value m, inserting a zero value as a first entry of the cumulative table of symbol occurrences, and inserting the received second integer value m as a last entry of the cumulative table of symbol occurrences.
The operations may further comprise obtaining the received second integer value m from a header metadata of the encoded symbol sequence.
The operations may further comprise decode the entries of the cumulative table by traversing a tree of subdivided decoding ranges and calculate an arithmetic division at each node of the tree before child nodes of said each node; and/or decoding the entries of the cumulative table by traversing the tree of subdivided decoding ranges in a depth-first pre-order and calculating an arithmetic division at each node of the tree.
The received integer value f is represented as a big number (bignum).
The operations may further comprise renormalizing to allow faster and more memory-efficient decoding.
The encoded symbol sequence may comprise an aggregation of different components comprising token, literal length, literals, offset, and match length, of sequences of an LZ4 block.
Using may consist of using only integer arithmetic, shifts, logic operations, loads and stores to recover entries of the table of symbol occurrences.
Applying may comprise applying Asymmetric Numeral Systems (ANS) entropy decoding to decode the received encoded symbol sequence.
The operations may further comprise iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or execute with at least one processor, instructions losslessly recovered by decoding the entropy-encoded symbol sequence; and/or generate with at least one graphics processing unit, at least a portion of an interactive graphical display based at least in part on graphical data losslessly recovered by decoding the entropy-encoded symbol sequence.

Example III

Decoding System

An embodiment of a system for generating an animated graphic may comprise at least one storage device that stores (i) at least one data block representing an encoded symbol sequence entropy-encoded using a table of symbol occurrences, and (ii) an integer value f encoding the table of symbol occurrences; at least one processor and/or processing circuit connected to the at least one storage device, the at least one processor and/or processing circuit performing operations comprising: using the integer value f to adaptively decode the table of symbol occurrences, including: (i) decoding each entry of a cumulative table of symbol occurrences by successively subdividing decoding ranges of the cumulative table of symbol occurrences at their respective middle indexes and, for each decoding range: calculating, from decoded entries of the cumulative table of symbol occurrences, an entry at a first index+f mod (an entry at a last index−the entry at the first index+1) to decode an entry at the respective middle index of the decoding range, and calculating f div(the entry at the last index−the entry at the first index+1) to update f; (ii) calculating the table of symbol occurrences from the decoded entries of the cumulative table of symbol occurrences; and applying the decoded table of symbol occurrences to entropy-decode the encoded symbol sequence represented by the at least one data block, at least a portion of the entropy-decoded symbol sequence representing a graphic and/or a graphic animation operation; and a device that generates an animated graphic based at least in part on the entropy-decoded symbol sequence.

In such embodiment:

The operations may further include: receiving a second integer value m, using a zero value as a lower bound of the cumulative table of symbol occurrences, and using the received second integer value m as an upper bound of the cumulative table of symbol occurrences.

The operations may further include: receiving a second integer value m, using a zero value as a first entry of the cumulative table of symbol occurrences, and inserting the received second integer value m as a last entry of the cumulative table of symbol occurrences.

The received second integer value m may be obtained from a header metadata of the encoded symbol sequence.

The operations may further comprise decoding the entries of the cumulative table by traversing a tree of subdivided decoding ranges and calculating an arithmetic division at each node of the tree before child nodes of said each node.

The operations may further comprise decoding the entries of the cumulative table by traversing the tree of subdivided decoding ranges in a depth-first pre-order and calculating an arithmetic division at each node of the tree.

The received integer value f may be represented as a big number (bignum).

The operations may further comprise renormalizing to allow faster and more memory-efficient decoding.

The encoded symbol sequence may comprise an aggregation of different components comprising token, literal length, literals, offset, and match length, of sequences of an LZ4 block.

Using may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The operations may further comprise iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or executing instructions losslessly recovered by decoding the entropy-encoded symbol sequence; and/or at least partly decoding the entropy-encoded symbol sequence in a cloud environment.

The device may comprise at least one graphics processing unit configured to generate at least a portion of an interactive graphical display based at least in part on graphical data losslessly recovered by decoding the entropy-encoded symbol sequence.

The device may include an emulator that generates the animated graphic based at least in part on the symbol sequence.

Example IV

Method of Operating a Decoding Cloud-Based Server or Computing Device

An embodiment of a method for operating a cloud-based device may comprise: send, over at least one network and/or communications link, a command and/or control signal to a remotely-located decoder processor and/or decoder processing circuit, the command and/or control signal causing the remotely-located decoder processor and/or decoder processing circuit to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences; and apply the calculated table of symbol occurrences to entropy-decode an encoded symbol sequence; and receive, over the at least one network and/or communications link, visual and/or audio information generated or produced at least in part using the entropy-decoded symbol sequence.

Figure 13H:
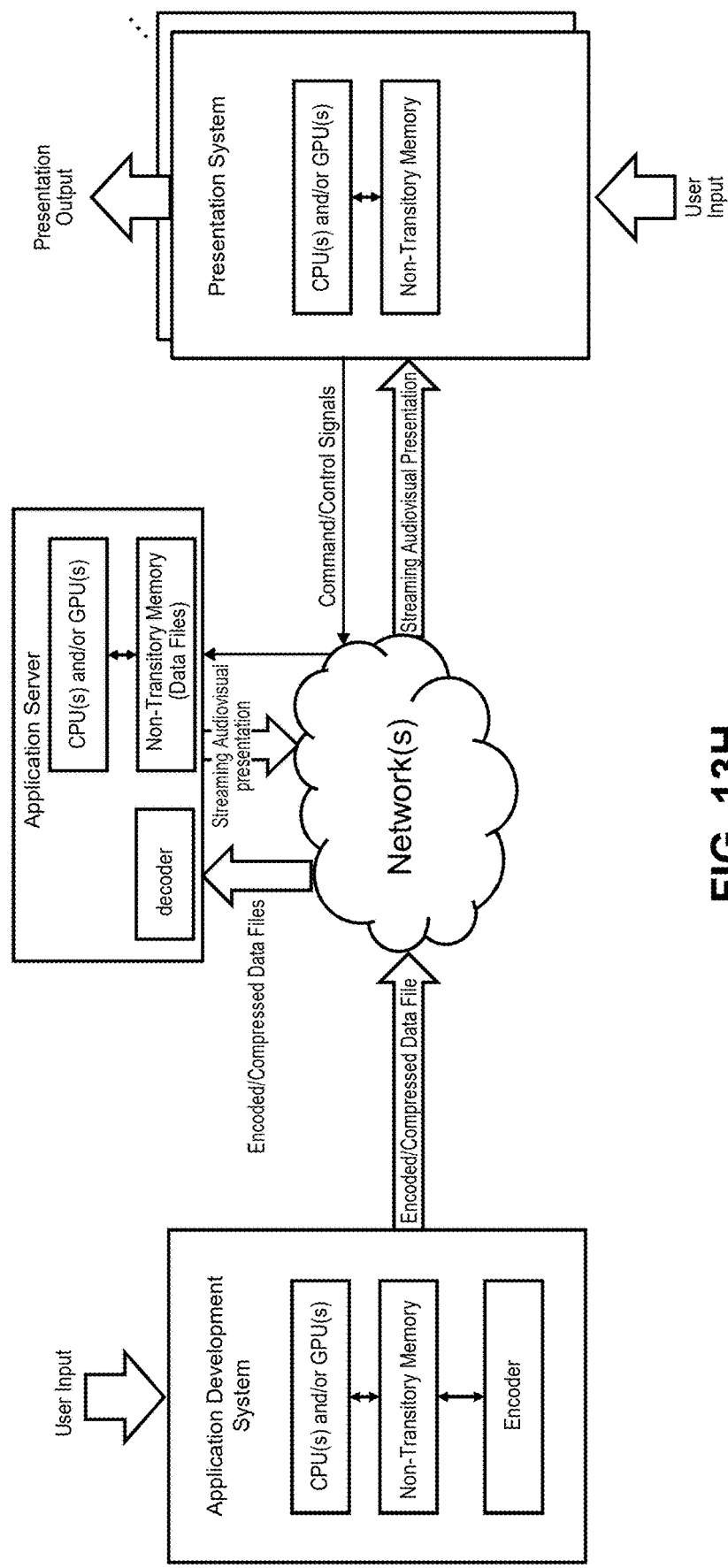

As FIG. 13H shows, one embodiment of an application server or other computing device including such a decoding system or decoder that is located "in the cloud", i.e., at a server farm or other remote location and connected to communicate with other devices remote to it via one or more network or other communications connections. The server or other computing device including a decoding system or decoder may receive or otherwise be provided with encoded (e.g., compressed) digital data files for decoding. In this context, the term "digital data" may include any sort of information including image data, sound data, computer or processor instructions, computer programs, commands, constants, and any and all other type(s) of information whatsoever. The term "data file" is thus not restricted to non-executable data, but may contain or encompass one or more computer programs that can be executed by one or more processors as one example. The data files may or may not include a file header and may or may not be organized in particular standardized type(s) of "data file format" such as described at wikipedia.org/wiki/List_of_file_formats.

The encoded compressed data files may be sourced/produced by an encoding system or encoder of the type described above that may or may not be part of or operatively coupled or connected to an application development system. The application development system may for example author, generate and/or produce the data file with or without human involvement or intervention. In one embodiment, the encoded compressed data files (e.g., computer instructions or programs, processor instructions, GPU instructions, image data such as texture data, etc.) may be provided by the encoding system or encoder to the decoding system or decoder in any number of ways such as over a digital network(s), over a communications link(s), via physically transportable tangible storage media(s) such as flash drive, or in any other convenient manner. The server or other computing device may include one or more non-transitory storage device(s) configured to store or retain the encoded compressed data files once the data files are provided to the decoding system or decoder. In another embodiment, the application development server and the cloud-located application server may be collocated with one another (and may for example comprise a unified or coordinated cloud-based content authorizing and distribution system such as an eshop).

The cloud-located decoding system or decoder may include one or more processors and/or processing circuits and/or graphics processing units that execute instructions stored in the non-transitory storage device(s). Such instruction execution causes the one or more processors and/or processing circuits and/or graphics processing units to access the stored encoded compressed data files and decode the stored encoded compressed data file(s) into decoded uncompressed data file(s) in a manner as described in detail above. The one or more processors and/or processing circuits and/or graphics processing units may execute such stored decoding instructions natively, or they may interpret or otherwise transform the stored instructions to provide decoding as described above, or they may emulate a hardware and/or software decoder, or use any combination of these techniques to provide decoder functionality as described in detail above. Alternately or in addition, the decoding process may be embedded in a hardware state machine or other hardware circuit decoder implementation. Or one part of the decoding process(es) may be implemented in instructions that are executable by one or more processors, and another part of the decoding process(es) may be implemented in one or more hardware circuits such as ASICs, state machines, etc.

Figure 14A:
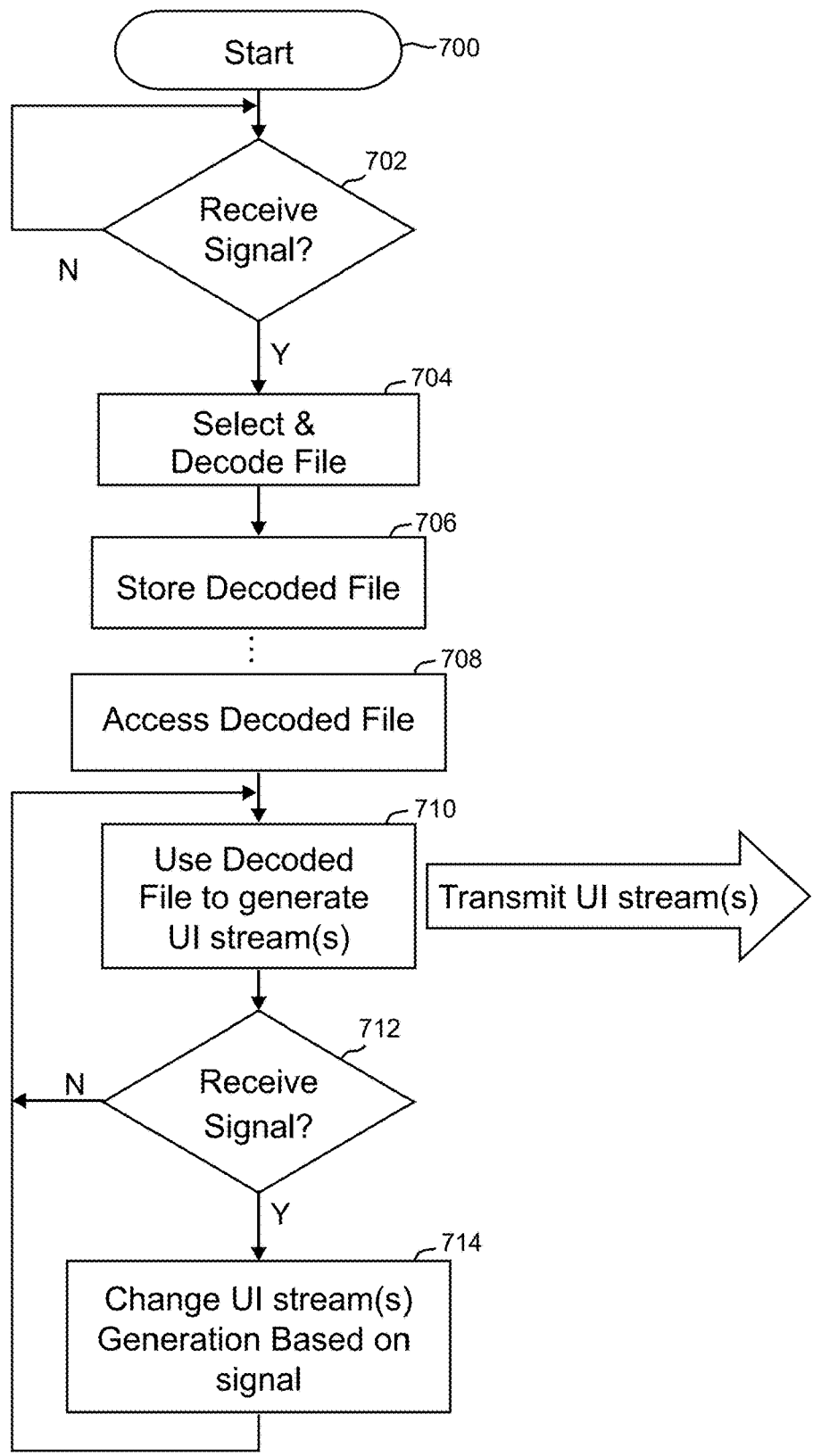
FIG. 14A is a flowchart of example operations performed by the FIG. 13H Application Server.
Figure 14B:
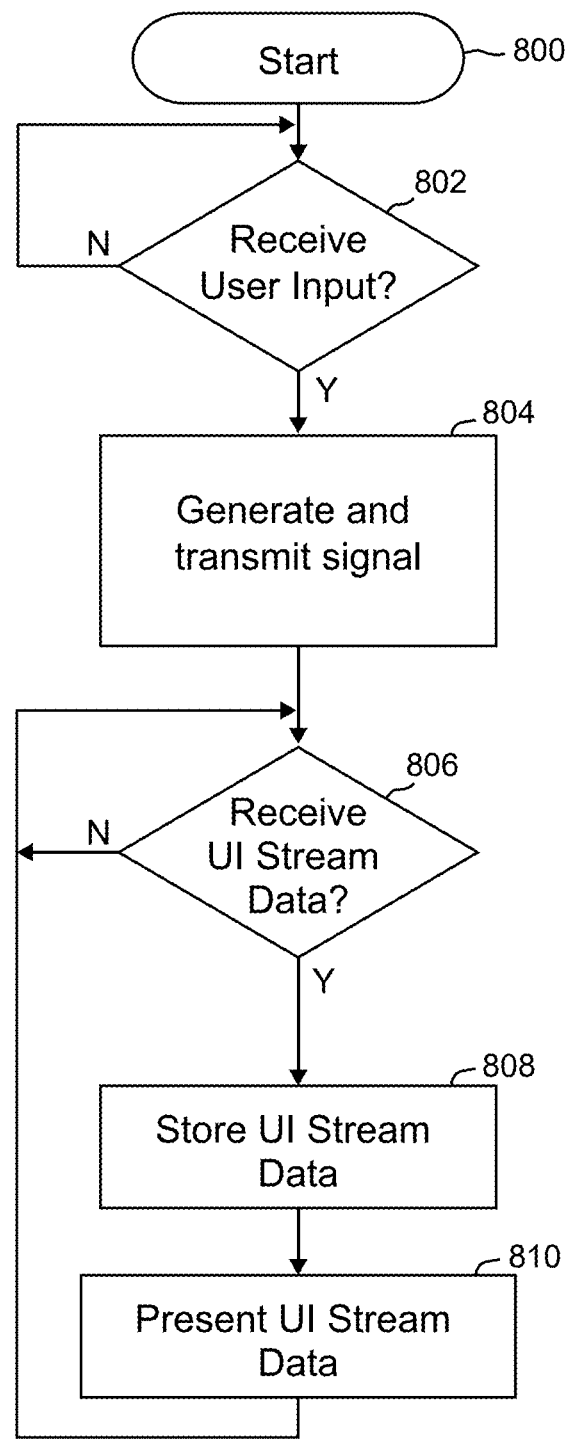
FIG. 14B is a flowchart of example operations performed by the FIG. 13H Presentation System.

As FIG. 13H shows, the decoding system or decoder may be triggered, initiated or otherwise controlled or caused to decode in response to one or more control signal the cloud-based server or other computing device receives over a network or other communications link from a remotely located device such as for example the presentation system. See FIG. 14A blocks 702, 704, 706. Thus, in one embodiment, the presentation system may generate a remote command or remote control signal (see FIG. 14B blocks 802, 804) that when communicated over a network or communications link to the cloud-based server or other computing device, causes the cloud-based decoding system or decoder to decode (FIG. 14A blocks 702, 704, 706). The presentation system may automatically generate such a command or control signal, or the presentation system can generate such a command or control signal in response to a human, e.g., requesting to play a particular game or use a particular application. FIG. 14B, blocks 802, 804. In response to such a human request, the presentation system may send a command or control signal to the cloud-located decoding system or decoder that specifies a stored encoded compressed data file(s) or association therewith responsive to the human's request, and causes the decoding system or decoder to access the particular stored encoded compressed data file(s), decode them, and store the decoded decompressed data file(s) in non-transitory memory (FIG. 14A, blocks 702, 704, 706). In this way for example, a human user at the presentation system can initiate "on demand" decoding of data files associated with a particular game the human user wants to play or a particular application the human user wants to use.

Once the cloud-located decoding system or decoder has decoded the stored encoded (compressed) data files to produce corresponding decoded (uncompressed) data files (as described in detail above), the cloud-located server or other computing device stores the decoded (uncompressed) data files in one or more non-transitory memory devices such as one or more register files, NAND flash devices, magnetic storage devices, semiconductor read/write memory (RAM), or the like (FIG. 14A block 706). Such stored decoded uncompressed data files are now available for the cloud-located server or other computing device to process and/or transmit.

In one embodiment, the cloud-based server or other computing device may access the decoded (uncompressed) data files e.g., stored in memory (or in one embodiment may retrieve these files from another source such as a remote source) (FIG. 14A block 708) and execute, process and/or otherwise use computer instructions, computer programs, processor instructions, GPU instructions, image data, or any other information within the decoded decompressed data files to automatically produce a visual and/or audio presentation(s) (FIG. 14A block 710). The visual and/or audio presentation may for example comprise a sequence of image frames and/or a sequence of sound frames providing one or more graphical user interfaces. In one example, the cloud-located server processors and/or processor circuits and/or graphics processing units may natively execute or process the computer instructions, computer programs, processor instructions, GPU instructions or other information of the decoded, uncompressed data file(s) to produce the visual and/or audio presentation. In another example, the cloud-located server processors and/or processor circuits and/or graphics processing units may emulate other hardware and/or software to produce the visual and/or audio presentation based at least in part on the computer instructions, computer programs, processor instructions, GPU instructions or other information of the decoded, uncompressed data file(s). See for example U.S. Pat. Nos. 11,911,700; 10,926,174; 9,662,574; USP 20230356078; Game Console GPUs pp 187-237 in Peddie, J., The History of the GPU—New Developments Springer, Cham. doi.org/10.1007/978-3-031-14047-1_4 (2022).

The cloud-located server processors and/or processing circuits and/or graphics processing units may be the same ones used to perform the decoding process described above, or they may be different processors and/or processing circuits and/or graphics processing units. In one embodiment, the cloud-located server processors and/or processing circuits and/or graphics processing units may be remotely controlled or caused to execute or otherwise process the computer instructions, computer programs, processor instructions, GPU instructions or other information of the decoded, uncompressed data file(s). For example, the cloud-located server processors and/or processing circuits and/or graphics processing units may be initiated, controlled or otherwise caused by a command or control signal to execute the computer instructions, computer programs, processor instructions, GPU instructions or other information of the decoded, uncompressed data file(s). Such a command or control signal may be provided for example by the presentation system and transmitted over a network or other communications link to the cloud-located server or other computing device (see FIG. 14B blocks 802, 804). The command or control signal may in one embodiment for example specify a particular game or other application. In one embodiment, the same command or control signal may be used to cause the decoding system or decoder to decode one or more encoded compressed data file(s) associated with the game so the decoded decompressed data file(s) may be used to generate a graphical audio and/or visual presentation corresponding to the game or other application (see FIG. 14A).

In one example embodiment, the cloud-located server or other computing device interacts with one, two or more human users (and/or automated "bots" in one embodiment) via associated presentation systems to generate the visual and/or audio presentation. For example, the presentation system(s) (which in one embodiment may comprise game consoles, portable or mobile gaming device, smart phones, tablets, or any other computing device capable of providing output discernible to a human) may each have at least one corresponding human user, and the human user(s) operates input devices such as joysticks, pointer type devices, mouse type devices, digit-operated buttons, or the like. The presentation system(s) may generate input signals based on human user operation of the input devices and transmit them (or information based on them) in real time or close to real time (i.e., with low latency) over one or more networks or other communications links from the presentation system(s) to the cloud-located server or other computing device. Different presentation system(s) may be disposed in different locations, and each presentation system may concurrently but independently generate input signals based on human user (and/or bot) operation of physical and/or virtual input devices at, for or associated with that presentation system.

The cloud-located server or other computing device may use such input signals to at least partly control graphical audio and/or visual presentations or information related thereto, corresponding to the game or other application. For example, the cloud-located server or other computing device may use first input signals provided by a first presentation system to control a first game character or second avatar and/or a first virtual camera/sound location viewpoint in a game, and may use second input signals provided by a second presentation system to control a second game character or second avatar and/or a second virtual camera/sound location viewpoint in the game. The cloud-located server or other computing device may in turn produce data representing at least portions of the same or different visual and/or audio display sequences in response to the first input signals and the second input signals, e.g., to provide a multi-player game or multi-user application where the different players or users experience the same or different (e.g., from different respective virtual camera/sound location viewpoints) visual and/or audio presentations. See FIG. 14A blocks 710, 712, 714; FIG. 14B blocks 802, 804. The cloud-located server or other computing device may for example update a visual and/or audio presentation once every $\frac{1}{30}^{th}$ or $\frac{1}{60}^{th}$ of a second or otherwise frequently to provide information the presentation systems may use to provide animated moving pictures and sound responsive to the first and second input signals. In one example embodiment, the application server generates and streams video and/or audio frames to the presentation systems for thin client presentation systems to present. In another example embodiment, each presentation system locally performs game processes in response to locally provided (and in some cases remotely provided) user inputs, and the application server provides coordination functions between presentation systems. In a further embodiment, the application server provides download services to the presentation systems by downloading encoded and/or decoded items such as executable code and/or control and coordination information the presentation systems use to generate user presentations locally.

In one embodiment, the cloud-located server or other computing device can stream or otherwise transmit information related to such visual and/or audio presentation(s) to one or any number of presentation systems for presentation to users. See FIG. 14A block 710. As noted above, such a cloud-based server or other computing device can access and use or execute the decoded instructions or data natively on a processor or other hardware, or translate or interpret the decoded instructions or data for use, or execute an emulator that is configured to be compatible with the decoded instructions or data, etc. See FIG. 14A block 708, 710.

In one embodiment, an emulator generates an animated graphic based at least in part on the entropy-decoded symbol sequence.

In one embodiment, the at least one processor and/or processing circuit is structured to at least partly decode the symbol sequence in a cloud environment.

In such embodiment:
receive may comprise receive data representing at least a portion of at least one graphical presentation based at least in part on the entropy-decoded symbol sequence.
The method may further include: receiving a second integer value m, using a zero value as a lower bound of the cumulative table of symbol occurrences, and using the received second integer value m as an upper bound of the cumulative table of symbol occurrences.
The method may further include: receiving a second integer value m, inserting a zero value as a first entry of the cumulative table of symbol occurrences, and inserting the received second integer value m as a last entry of the cumulative table of symbol occurrences.
The received second integer value m may be obtained from a header metadata of the encoded symbol sequence.
The method may further include decoding the entries of the cumulative table by traversing a tree of subdivided decoding ranges and calculating an arithmetic division at each node of the tree before child nodes of said each node. The entries of the cumulative table may be decoded by traversing the tree of subdivided decoding ranges in a depth-first pre-order and calculating an arithmetic division at each node of the tree.
The received integer value f may be represented as a big number (bignum).
The method may further include renormalizing to allow faster and more memory-efficient decoding.
The encoded symbol sequence may comprise an aggregation of different components comprising token, literal length, literals, offset, and match length, of sequences of an LZ4 block.
Using f may consist of using only integer arithmetic, shifts, logic operations, loads and stores to recover entries of the table of symbol occurrences.
Applying may comprise applying Asymmetric Numeral Systems (ANS) entropy decoding to decode the received encoded symbol sequence.
The method may further include iterating or recursing the successively subdividing and the calculating for each decoding range; and/or independently decoding segments of the encoded symbol sequence resulting from entropy-based binary segmentation of the symbol sequence and reconstructing the symbol sequence based on segment headers; and/or executing with at least one processor, instructions losslessly recovered by decoding the entropy-encoded symbol sequence; and/or generating with at least one graphics processing unit, at least a portion of an interactive graphical display based at least in part on graphical data losslessly recovered by decoding the entropy-encoded symbol sequence.

Example V

Encoding Method

An example embodiment of an encoding method performed using at least one processor and/or processing circuit, may comprise: generating a table of symbol occurrences based on occurrences of symbols in a symbol sequence to be entropy-encoded; entropy-encoding the symbol sequence using the table of symbol occurrences; using an integer value f to adaptively encode the table of symbol occurrences including: (i) calculating a cumulative table of symbol occurrences from the table of symbol occurrences, (ii) encoding each entry of the cumulative table of symbol occurrences by successively subdividing encoding ranges of the cumulative table of symbol occurrences at their respective middle indexes and, for each encoding range: calculating f×(an entry at a last index−an entry at a first index+1)+(an entry at the respective middle index−the entry at the first index) to encode an entry at the respective middle index of the encoding range and update f; and forming at least one data block representing (i) the entropy-encoded symbol sequence, and (ii) the resulting integer value f encoding the table of symbol occurrences.

The above corresponds in example embodiments described in more detail below to:
«Cumulative interpolative coding» encodes table F by:
Calculating table C from table F
Encoding table C with «interpolative coding»
In such embodiment:
Encoding may further include generating a second integer value m, using a zero value as a lower bound of the cumulative table of symbol occurrences, and using the generated second integer value m as an upper bound of the cumulative table of symbol occurrences.
Encoding may further include generating a second integer value m, inserting a zero value as a first entry of the cumulative table of symbol occurrences, and inserting the generated second integer value m as a last entry of the cumulative table of symbol occurrences.
The operations may further comprise including the second integer value m as metadata in a header associated with the encoded symbol sequence.
Encoding may further include encoding the entries of the cumulative table by traversing a tree of subdivided encoding ranges and calculating an arithmetic multiplication at each node after child nodes of each said node.
Encoding may further include encoding the entries of the cumulative table by traversing the tree of subdivided encoding ranges in a depth-first reverse post-order and calculating an arithmetic multiplication at each node.
Encoding may further include representing the generated integer value f as a big number (bignum).
Encoding may further include renormalizing to allow faster and more memory-efficient decoding.

The symbol sequence may comprise an aggregation of different components comprising token, literal length, literals, offset, and match length, of sequences of an LZ4 block.
Using the integer value f may consist of using only integer arithmetic, shifts, logic operations, loads and stores to encode entries of the table of symbol occurrences.
Applying may comprise applying Asymmetric Numeral Systems (ANS) entropy encoding to encode the symbol sequence.
Encoding may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.
The symbol sequence may include losslessly-encoded executable instructions and/or bit sequences configured to control a graphics processing unit to generate at least a portion of an interactive graphical display.
The encoding may further include segmenting the symbol sequence before encoding using an entropy-based binary segmentation that reduces or minimizes at each segmentation step, a sum of entropy and a size of the table of symbol occurrences of all resulting segments.

Example VI

Encoder

In another embodiment, an encoder comprises at least one processor and/or processing circuit for performing operations comprising: entropy-encoding a symbol sequence using a table of symbol occurrences; generating an integer value f using interpolative encoding of the table of symbol occurrences, including adaptively encoding a cumulative table of symbol occurrences comprising repeatedly changing an encoding range of the cumulative table of symbol occurrences based on a subdivision of previous encoding range(s) at a middle index, and for each encoding range: calculating, from the cumulative table of symbol occurrences, f×(an entry at a last index−an entry at a first index+1)+(an entry at the middle index−the entry at the first index) to encode the entry at the middle index and update f; and forming at least one data block representing the encoded symbol sequence entropy-encoded using the table of symbol occurrences, and the integer value f representing the encoded table of symbol occurrences.

In such embodiment:
The operations may further comprise: generating a second integer value m, using a zero value as a lower bound of the cumulative table of symbol occurrences, and using the generated second integer value m as an upper bound of the cumulative table of symbol occurrences.
The operations may further comprise: generating a second integer value m, inserting a zero value as a first entry of the cumulative table of symbol occurrences, and inserting the generated second integer value m as a last entry of the cumulative table of symbol occurrences.
The operations may further comprise including the second integer value m as metadata in a header associated with the encoded symbol sequence.
The operations may further comprise encoding the entries of the cumulative table by traversing a tree of subdivided encoding ranges and calculating an arithmetic multiplication at each node after child nodes of each said node.

The operations may further include encoding the entries of the cumulative table by traversing the tree of subdivided encoding ranges in a depth-first reverse post-order and calculating an arithmetic multiplication at each node; and/or representing the generated integer value f as a big number (bignum); and/or renormalizing to allow faster and more memory-efficient encoding.

The symbol sequence may comprise an aggregation of different components comprising token, literal length, literals, offset, and match length, of sequences of an LZ4 block.

Using f may consist of using only integer arithmetic, shifts, logic operations, loads and stores to encode entries of the table of symbol occurrences.

Applying may comprise applying Asymmetric Numeral Systems (ANS) entropy encoding to encode the symbol sequence.

The operations may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.

The symbol sequence may include losslessly-encoded executable instructions.

The symbol sequence may include bit sequences configured to control at least one graphics processing unit to generate at least a portion of an interactive graphical display.

The operations may further include segmenting the symbol sequence before encoding using an entropy-based binary segmentation that reduces or minimizes at each segmentation step, a sum of entropy and a size of the table of symbol occurrences of all resulting segments.

Example VII

Encoding System

An embodiment of a system for generating an animated graphic may comprise: at least one storage device; and at least one processor and/or processing circuit connected to the at least one storage device, the at least one processor and/or processing circuit performing operations comprising: generating a table of symbol occurrences based on occurrences of symbols in a symbol sequence to be entropy-encoded, the symbol sequence at least in part contributing to generation of an animated graphic; entropy-encoding the symbol sequence using the table of symbol occurrences; using an integer value f to adaptively encode the table of symbol occurrences, including: (i) calculating a cumulative table of symbol occurrences from the table of symbol occurrences, (ii) encoding each entry of the cumulative table of symbol occurrences by successively subdividing encoding ranges of the cumulative table of symbol occurrences at respective middle indexes and, for each encoding range: calculating f×(an entry at a last index−an entry at a first index+1)+(an entry at the respective middle index−the entry at the first index) to encode an entry at the respective middle index of the encoding range and update f; forming at least one data block representing (i) the entropy-encoded symbol sequence, and (ii) the integer value f representing the encoded table of symbol occurrences; and storing the at least one data block in the storage device.

In such embodiment:

The operations may further comprise: generating a second integer value m, using a zero value as a lower bound of the cumulative table of symbol occurrences, and using the generated second integer value m as an upper bound of the cumulative table of symbol occurrences.

The operations may further comprise: generating a second integer value m, inserting a zero value as a first entry of the cumulative table of symbol occurrences, and inserting the generated second integer value m as a last entry of the cumulative table of symbol occurrences.

The operations may further comprise including the second integer value m as metadata in a header associated with the encoded symbol sequence.

The operations may further comprise encoding the entries of the cumulative table by traversing a tree of subdivided encoding ranges and calculating an arithmetic multiplication at each node after child nodes of each said node.

The operations may further include encoding the entries of the cumulative table by traversing the tree of subdivided encoding ranges in a depth-first reverse post-order and calculating an arithmetic multiplication at each node; and/or representing the received integer value f as a big number (bignum); and/or renormalizing to allow faster and more memory-efficient encoding.

The symbol sequence may comprise an aggregation of different components comprising token, literal length, literals, offset, and match length, of sequences of an LZ4 block.

Using f may consist of using only integer arithmetic, shifts, logic operations, loads and stores to encode entries of the table of symbol occurrences.

Applying may comprise applying Asymmetric Numeral Systems (ANS) entropy encoding to encode the symbol sequence.

The operations may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.

The symbol sequence may include losslessly-encoded executable instructions.

The symbol sequence may include bit sequences configured to control at least one graphics processing unit to generate at least a portion of an interactive graphical display.

The operations may further include segmenting the symbol sequence before encoding using an entropy-based binary segmentation that reduces or minimizes at each segmentation step, a sum of entropy and a size of the table of symbol occurrences of all resulting segments.

Example VIII

Non-Transitory Storage Medium for Decoding

An embodiment of a non-transitory storage may be configured to store instructions that cause at least one processor and/or processing circuit to perform operations comprising: access an integer value f that encodes a table of symbol occurrences; use the integer value f to adaptively decode the table of symbol occurrences, including: (i) decode each entry of a cumulative table of symbol occurrences by successively subdividing decoding ranges of the cumulative table of symbol occurrences at their respective middle indexes and, for each decoding range: calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and (ii) calculate the table of symbol occurrences from the decoded entries of the cumulative table of symbol occurrences.

In such embodiment, the operations may further comprise:

apply the calculated table of symbol occurrences to entropy-decode an encoded symbol sequence and/or use at least a portion of the entropy-decoded symbol sequence to stream data representing at least a portion of a graphical user interaction; and/or execute at least a portion of the entropy-decoded symbol sequence; and/or stream at least a portion of the entropy-decoded symbol sequence.

receiving a second integer value m, using a zero value as a lower bound of the cumulative table of symbol occurrences, and using the received second integer value m as an upper bound of the cumulative table of symbol occurrences.

receiving a second integer value m, inserting a zero value as a first entry of the cumulative table of symbol occurrences, and inserting the received second integer value m as a last entry of the cumulative table of symbol occurrences.

obtaining the received second integer value m from a header metadata of the encoded symbol sequence.

decode the entries of the cumulative table by traversing a tree of subdivided decoding ranges and calculating an arithmetic division at each node of the tree before child nodes of said each node; and/or decoding the entries of the cumulative table by traversing the tree of subdivided decoding ranges in a depth-first pre-order and calculating an arithmetic division at each node of the tree.

In such embodiment:

The received integer value f may be represented as a big number (bignum).

The operations may further comprise renormalizing to allow faster and more memory-efficient decoding.

The encoded symbol sequence may comprise an aggregation of different components comprising token, literal length, literals, offset, and match length, of sequences of an LZ4 block.

Using f may consist of using only integer arithmetic, shifts, logic operations, loads and stores to recover entries of the table of symbol occurrences.

Applying may comprise applying Asymmetric Numeral Systems (ANS) entropy decoding to decode the received encoded symbol sequence.

The operations may further comprise iterating the successively subdividing and the calculating for each decoding range; and/or recursing the successively subdividing and the calculating for each decoding range.

The operations may further comprise independently decoding segments of the encoded symbol sequence resulting from entropy-based binary segmentation of the symbol sequence and reconstructing the symbol sequence based on segment headers.

Example IX

Non-Transitory Storage Medium for Encoding

An example embodiment non-transitory storage medium stores instructions for causing at least one processor and/or processing circuit to perform operations comprising: generating a table of symbol occurrences based on occurrences of symbols in a symbol sequence to be entropy-encoded; entropy-encoding the symbol sequence using the table of symbol occurrences; using an integer value f to adaptively encode the table of symbol occurrences including: (i) calculating a cumulative table of symbol occurrences from the table of symbol occurrences, (ii) encoding each entry of the cumulative table of symbol occurrences by successively subdividing encoding ranges of the cumulative table of symbol occurrences at their respective middle indexes and, for each encoding range: calculating f×(an entry at a last index−an entry at a first index+1)+(an entry at the respective middle index−the entry at the first index) to encode an entry at the respective middle index of the encoding range and update f; and forming at least one data block representing (i) the entropy-encoded symbol sequence, and (ii) the resulting integer value f encoding the table of symbol occurrences.

In such embodiment:

The operations may further include receiving a second integer value m, using a zero value as a lower bound of the cumulative table of symbol occurrences, and using the received second integer value m as an upper bound of the cumulative table of symbol occurrences.

The operations may further include receiving a second integer value m, inserting a zero value as a first entry of the cumulative table of symbol occurrences, and inserting the received second integer value m as a last entry of the cumulative table of symbol occurrences.

The operations may further comprise including the second integer value m as metadata in a header associated with the encoded symbol sequence.

The operations may further include encoding the entries of the cumulative table by traversing a tree of subdivided encoding ranges and calculating an arithmetic multiplication at each node after child nodes of each said node.

The operations may further include encoding the entries of the cumulative table by traversing the tree of subdivided encoding ranges in a depth-first reverse post-order and calculating an arithmetic multiplication at each node.

The operations may further include representing the received integer value f as a big number (bignum).

The operations may further include renormalizing to allow faster and more memory-efficient decoding.

The symbol sequence may comprise an aggregation of different components comprising token, literal length, literals, offset, and match length, of sequences of an LZ4 block.

Using the integer value f may consist of using only integer arithmetic, shifts, logic operations, loads and stores to encode entries of the table of symbol occurrences.

Applying may comprise applying Asymmetric Numeral Systems (ANS) entropy encoding to encode the symbol sequence.

The operations may further include iterating or recursing the successively subdividing and the calculating for each encoding range; and/or independently encoding segments of the encoded symbol sequence resulting from entropy-based binary segmentation of the symbol sequence and specifying an order of the segments of the symbol sequence within segment headers.

The symbol sequence may include losslessly-encoded executable instructions and/or bit sequences configured to control a graphics processing unit to generate at least a portion of an interactive graphical display.

The operations may further include segmenting the symbol sequence before encoding using an entropy-based binary segmentation that reduces or minimizes at each segmentation step, a sum of entropy and a size of the table of symbol occurrences of all resulting segments.

Example X

The Encoding Device and Decoding Device may be the same device.

Example XI

The Encoding Method and Decoding Method may be the combined in a common overall method.

Example XII

Algorithm 1/Algorithm 2 to encode/decode an entropy table.

Example XIII

Sections of Algorithm 1/Algorithm 2 to encode/decode part of a cumulative table.

Example XIV

Algorithm 3/Algorithm 4 to encode/decode an arbitrary-length sequence of symbols Example XV Algorithm 5/Algorithm 6 to encode/decode an arbitrary-length sequence of symbols using a low-cost entropy-based binary segmentation to improve the compression ratio.

Example XVI

Algorithm 5/Algorithm 6 to encode encode/decode an LZ4 block by grouping the streams of the block sequences by type and encoding all or some of the groups independently.

Some Example Related Work

Binary Interpolative Coding:
  Binary Interpolative Coding for Effective Index Compression: https://link.springer.com/article/10.1023/A:1013002601898
  Housekeeping for Prefix Coding: https://www.researchgate.net/publication/3160122
  Large-Alphabet Semi-Static Entropy Coding Via Asymmetric Numeral Systems: https://www.researchgate.net/publication/342752784
  Encoding of probability distributions for Asymmetric Numeral Systems: https://www.researchgate.net/publication/352373099

Binary Segmentation:
  Selective review of offline change point detection methods: https://arxiv.org/abs/1801.00718
  ruptures: change point detection in Python: https://arxiv.org/abs/1801.00826
  Change Point Detection with Copula Entropy based Two-Sample Test: https://arxiv.org/abs/2403.07892
  Change-point detection using the conditional entropy of ordinal patterns: https://arxiv.org/abs/1510.01457
  Optimal detection of changepoints with a linear computational cost: https://arxiv.org/abs/1101.1438
  Using an adaptive entropy-based threshold for change detection methods—Application to fault-tolerant fusion in collaborative mobile robotics: https://ieeexplore.ieee.org/document/8820667

All patents and publications cited herein are incorporated by reference as if expressly set forth.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A decoder comprising at least one processor and/or processing circuit configured to perform operations comprising:
  access an integer value f that encodes a table of symbol occurrences;
  use the integer value f to adaptively decode the table of symbol occurrences, including:
    (i) decode each entry of a cumulative table of symbol occurrences by successively subdividing decoding ranges of the cumulative table of symbol occurrences at their respective middle indexes and, for each decoding range:
      calculate, from decoded entries of the cumulative table of symbol occurrences, an entry at a first index+f mod(an entry at a last index−the entry at the first index+1) to decode an entry at the respective middle index of the decoding range, and calculate f div(the entry at the last index−the entry at the first index+1) to update f; and
    (ii) calculate the table of symbol occurrences from the decoded entries of the cumulative table of symbol occurrences.

2. The decoder of claim 1 wherein the operations further include apply the calculated table of symbol occurrences to entropy-decode an encoded symbol sequence.

3. The decoder of claim 2 wherein the operations further comprise execute at least a portion of the entropy-decoded symbol sequence.

4. The decoder of claim 2 wherein the operations further comprise stream at least a portion of the entropy-decoded symbol sequence and/or information derived therefrom.

5. The decoder of claim 1 wherein the operations further comprise:
  receiving a second integer value m,
  using a zero value as a lower bound of the cumulative table of symbol occurrences, and
  using the received second integer value m as an upper bound of the cumulative table of symbol occurrences.

6. The decoder of claim 5 wherein the operations further comprise obtaining the received second integer value m from a header metadata of the encoded symbol sequence.

7. The decoder of claim 1 wherein the operations further comprise:
receiving a second integer value m,
inserting a zero value as a first entry of the cumulative table of symbol occurrences, and
inserting the received second integer value m as a last entry of the cumulative table of symbol occurrences.

8. The decoder of claim 1 wherein the operations further comprise decode the entries of the cumulative table by traversing a tree of subdivided decoding ranges and calculate an arithmetic division at each node of the tree before child nodes of said each node.

9. The decoder of claim 8 wherein the operations further comprise decoding the entries of the cumulative table by traversing the tree of subdivided decoding ranges in a depth-first pre-order and calculating an arithmetic division at each node of the tree.

10. The decoder of claim 1 wherein the received integer value f is represented as a big number (bignum).

11. The decoder of claim 1 wherein the operations further comprise renormalizing to allow faster and more memory-efficient decoding.

12. The decoder of claim 1 wherein the encoded symbol sequence comprises an aggregation of different components comprising token, literal length, literals, offset, and match length, of sequences of an LZ4 block.

13. A non-transitory storage configured to store instructions that cause at least one processor and/or processing circuit to perform operations comprising:
access an integer value f that encodes a table of symbol occurrences;
use the integer value f to adaptively decode the table of symbol occurrences, including:
(i) decode each entry of a cumulative table of symbol occurrences by successively subdividing decoding ranges of the cumulative table of symbol occurrences at their respective middle indexes and, for each decoding range:
calculate, from decoded entries of the cumulative table of symbol occurrences, an entry at a first index+f mod(an entry at a last index−the entry at the first index+1) to decode an entry at the respective middle index of the decoding range, and
calculate f div(the entry at the last index−the entry at the first index+1) to update f; and
(ii) calculate the table of symbol occurrences from the decoded entries of the cumulative table of symbol occurrences.

14. The non-transitory storage of claim 13 wherein the operations further comprise apply the calculated table of symbol occurrences to entropy-decode an encoded symbol sequence.

15. The non-transitory storage of claim 14 wherein the operations further comprise use at least a portion of the entropy-decoded symbol sequence to stream data representing at least a portion of a graphical user interaction.

16. The non-transitory storage of claim 14 wherein the operations further comprise execute at least a portion of the entropy-decoded symbol sequence.

17. The non-transitory storage of claim 14 wherein the operations further comprise stream information based on at least a portion of the entropy-decoded symbol sequence.

18. The non-transitory storage of claim 14 wherein the encoded symbol sequence comprises an aggregation of different components comprising token, literal length, literals, offset, and match length, of sequences of an LZ4 block.

19. The non-transitory storage of claim 14 wherein applying comprises applying Asymmetric Numeral Systems (ANS) entropy decoding to decode the received encoded symbol sequence.

20. The non-transitory storage of claim 13 wherein the operations further comprise iterating the successively subdividing and the calculating for each decoding range.

21. The non-transitory storage of claim 13 wherein the operations further comprise recursing the successively subdividing and the calculating for each decoding range.

22. The non-transitory storage of claim 14 wherein the operations further comprise independently decoding segments of the encoded symbol sequence resulting from entropy-based binary segmentation of the symbol sequence and reconstructing the symbol sequence based on segment headers.

23. The non-transitory storage of claim 13 wherein the operations further comprise:
receiving a second integer value m,
using a zero value as a lower bound of the cumulative table of symbol occurrences, and
using the received second integer value m as an upper bound of the cumulative table of symbol occurrences.

24. The non-transitory storage of claim 23 wherein the operations further comprise obtaining the received second integer value m from a header metadata of the encoded symbol sequence.

25. The non-transitory storage of claim 13 wherein the operations further comprise:
receiving a second integer value m,
inserting a zero value as a first entry of the cumulative table of symbol occurrences, and
inserting the received second integer value m as a last entry of the cumulative table of symbol occurrences.

26. The non-transitory storage of claim 13 wherein the operations further comprise decode the entries of the cumulative table by traversing a tree of subdivided decoding ranges and calculating an arithmetic division at each node of the tree before child nodes of said each node.

27. The non-transitory storage of claim 26 wherein the operations further comprise decoding the entries of the cumulative table by traversing the tree of subdivided decoding ranges in a depth-first pre-order and calculating an arithmetic division at each node of the tree.

28. The non-transitory storage of claim 13 wherein the received integer value f is represented as a big number (bignum).

29. The non-transitory storage of claim 13 wherein the operations further comprise renormalizing to allow faster and more memory-efficient decoding.

30. The non-transitory storage of claim 13 wherein the operations further comprise using only integer arithmetic, shifts, logic operations, loads and stores to recover entries of the table of symbol occurrences from integer value f.

* * * * *